United States Patent
Jeong et al.

(10) Patent No.: US 12,349,571 B2
(45) Date of Patent: *Jul. 1, 2025

(54) DISPLAY DEVICE

(71) Applicant: LG DISPLAY CO., LTD., Seoul (KR)

(72) Inventors: HoYoung Jeong, Gyeonggi-do (KR); Harkjin Kim, Incheon (KR)

(73) Assignee: LG Display Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/601,140

(22) Filed: Mar. 11, 2024

(65) Prior Publication Data

US 2024/0215361 A1  Jun. 27, 2024

Related U.S. Application Data

(63) Continuation of application No. 18/174,406, filed on Feb. 24, 2023, now Pat. No. 11,963,414, which is a
(Continued)

(30) Foreign Application Priority Data

Dec. 3, 2019 (KR) .......................... 10-2019-0158908

(51) Int. Cl.
*H10K 59/131* (2023.01)
*G06F 3/041* (2006.01)
(Continued)

(52) U.S. Cl.
CPC ......... *H10K 59/131* (2023.02); *G06F 3/0412* (2013.01); *G06F 3/04164* (2019.05);
(Continued)

(58) Field of Classification Search
CPC .... H10K 59/131; H10K 59/126; H10K 59/40; H10K 59/60; H10K 59/65; H10K 59/12;
(Continued)

(56) References Cited

U.S. PATENT DOCUMENTS 9,577,020 B2  2/2017  Kaplan et al.
9,899,622 B2  2/2018  Lee et al.
(Continued)

FOREIGN PATENT DOCUMENTS

CN   110070801 A   7/2019
CN   209265332 U   8/2019
(Continued)

OTHER PUBLICATIONS

Japanese Office Action dated Oct. 14, 2021 issued in corresponding Patent Application No. 2020-199299 w/ Machine Translation (12 pages).
(Continued)

*Primary Examiner* — Prabodh M Dharia
(74) *Attorney, Agent, or Firm* — Fish & Richardson P.C.

(57) ABSTRACT

A display device includes a display panel including a display area on which an image is displayed, a substrate, and an electrode located over the substrate and disposed in the display area; and a camera photographing a front of the display panel without being exposed to the front surface of the display panel, being disposed under the display area of the display panel, and overlapping with a first area in the display area, wherein the electrode overlaps with the first area, and wherein the electrode comprises a semi-transmissive layer positioned over the substrate, an optical path compensation layer positioned on the semi-transmissive layer, and a metal layer positioned on the optical path compensation layer.

19 Claims, 27 Drawing Sheets

Related U.S. Application Data continuation of application No. 17/110,146, filed on Dec. 2, 2020, now Pat. No. 11,616,114.

(51) Int. Cl.
    *G06F 3/044*         (2006.01)
    *G06V 40/13*         (2022.01)
    *H04N 23/57*         (2023.01)
    *H10K 59/126*       (2023.01)
    *H10K 59/40*         (2023.01)

(52) U.S. Cl.
CPC .......... *H04N 23/57* (2023.01); *H10K 59/126* (2023.02); *G06F 3/0446* (2019.05); *G06F 2203/04111* (2013.01); *G06V 40/1306* (2022.01); *H10K 59/40* (2023.02)

(58) Field of Classification Search
CPC .... H10K 59/84; H10K 59/85; G06F 3/04164; G06F 3/0446; G06F 3/0443; G06F 3/041; G06F 2203/04111; G06F 2203/04108; G06F 2203/04112; H04N 23/57; G06V 40/1306
USPC ............................................... 257/72; 427/79
See application file for complete search history.

(56) References Cited

U.S. PATENT DOCUMENTS

| | | | |
|---|---|---|---|
| 10,971,571 | B2 | 4/2021 | Won et al. |
| 2013/0313672 | A1 | 11/2013 | Min |
| 2014/0054554 | A1 | 2/2014 | Lee et al. |
| 2014/0131679 | A1 | 5/2014 | Lee et al. |
| 2014/0183471 | A1 | 7/2014 | Heo |
| 2014/0354931 | A1 | 12/2014 | Kurasawa et al. |
| 2015/0185915 | A1* | 7/2015 | Lim ............... G06F 3/0445 427/79 |
| 2015/0220191 | A1 | 8/2015 | Huh et al. |
| 2016/0049454 | A1 | 2/2016 | Park et al. |
| 2016/0049615 | A1 | 2/2016 | Kim et al. |
| 2016/0378224 | A1 | 12/2016 | Kwon et al. |
| 2017/0068287 | A1 | 3/2017 | Jung et al. |
| 2018/0069191 | A1* | 3/2018 | Lee ................. H10K 59/80522 |
| 2018/0121002 | A1* | 5/2018 | Kim ................ G06F 3/04164 |
| 2018/0182816 | A1 | 6/2018 | Kang et al. |
| 2018/0182817 | A1* | 6/2018 | Jo ................... G06F 3/0412 |
| 2018/0307884 | A1* | 10/2018 | Xu ................... H10K 77/111 |
| 2018/0308902 | A1 | 10/2018 | Lee et al. |
| 2018/0348911 | A1 | 12/2018 | Lee et al. |
| 2019/0131379 | A1 | 5/2019 | Won et al. |
| 2019/0391691 | A1 | 12/2019 | Zhou |
| 2020/0150800 | A1 | 5/2020 | Kwak et al. |
| 2021/0118909 | A1 | 4/2021 | Hsieh |
| 2022/0190083 | A1 | 6/2022 | Yang |
| 2022/0190084 | A1 | 6/2022 | Li |

FOREIGN PATENT DOCUMENTS

| | | |
|---|---|---|
| CN | 110518034 A | 11/2019 |
| CN | 110518038 A | 11/2019 |
| EP | 3401701 A1 | 11/2018 |
| JP | 2005-033784 A | 2/2005 |
| JP | 2010-509804 A | 3/2010 |
| JP | 2011-118330 A | 6/2011 |
| JP | 2012-199220 A | 10/2012 |
| JP | 2013247672 A | 12/2013 |
| JP | 2018109963 A | 7/2018 |
| JP | 2018-205744 A | 12/2018 |
| JP | 2019-506766 A | 3/2019 |
| JP | 2019-83195 A | 5/2019 |
| KR | 10-2012-0107350 | 10/2012 |
| KR | 10-2014-0025682 A | 3/2014 |
| KR | 10-2014-0060642 A | 5/2014 |
| KR | 10-2016-0024061 A | 3/2016 |
| KR | 10-2016-0027280 A | 3/2016 |
| KR | 10-2017-0064606 A | 6/2017 |
| KR | 10-2019-0048784 | 5/2019 |
| WO | 2012/090794 A1 | 7/2012 |
| WO | WO 2013/047457 A1 | 4/2013 |
| WO | 2019213839 A1 | 11/2019 |

OTHER PUBLICATIONS

Japanese Office Action dated Jun. 27, 2023 issued in Patent Application No. 2022-165000 w/English Translation (18 pages).

Chinese Office Action dated Jul. 1, 2024 issued in Patent Application No. 202011346399.0 w/English Translation.

Korean Office Action dated Sep. 18, 2024 issued in Patent Application No. 10-2019-0158908 (11 pages).

Office Action in Japanese Appln. No. 2024-022681, mailed on Jan. 7, 2025, 14 pages (with English translation).

Office Action in Chinese Appln. No. 202011346399.0, mailed on Mar. 28, 2025, 8 pages (with English translation).

* cited by examiner

DISPLAY DEVICE

CROSS-REFERENCE TO RELATED APPLICATIONS

This application is a continuation of U.S. patent application Ser. No. 18/174,406, filed on Feb. 24, 2023, which is a continuation of U.S. patent application Ser. No. 17/110,146, filed on Dec. 2, 2020, now U.S. Pat. No. 11,616,114, issued on Mar. 28, 2023, which claims the priority of Korean Patent Application No. 10-2019-0158908, filed on Dec. 3, 2019, which are hereby incorporated by reference in their entirety for all purposes as if fully set forth herein.

BACKGROUND

Field of the Disclosure

The present disclosure relates to a display device.

Description of the Background

As the information society develops, demands for display devices displaying images are increasing, and various types of display devices such as liquid crystal display devices, organic light emitting display devices, or quantum dot display devices are being used.

In addition, the display device provides an input method using a touch sensor or the like, and an optical device such as a camera and a proximity sensor to provide a variety of application functions to the user. Due to this, there is a problem that the design of the display device becomes difficult. In particular, since the camera and the proximity sensor are forced to be exposed to the outside for the entrance and exit of light, there is a problem in that the display area of the display panel must be reduced.

In general, the front design of the display device is designed as a design having a large bezel for installation and exposure of the optical device, a design in which the display panel is cut out in a notch shape, or the optical device is displayed. There has been a problem that is designed with a design that is exposed in the form of a hole in a part of the panel.

SUMMARY

Accordingly, the present disclosure is to provide a display device in which the camera photographing the front is disposed under the display panel so that the camera is not exposed to the front.

The present disclosure also provides a display device capable of acquiring a high quality front image even when the camera photographing the front is disposed under the display panel so that the camera is not exposed to the front.

Further, the present disclosure provides a display device that obtains a high-resolution image by preventing the external light from being repeatedly reflected between the wirings in the display panel and the camera. The external light is light required for front shooting of the camera disposed under the display panel, and is light that enters the interior of the display panel.

In accordance with an aspect of the present disclosure, there may be provided with a display device, comprising: a display panel including a display area on which an image is displayed, a substrate, and a first wiring located over the substrate and disposed in the display area; and a camera photographing the front of the display panel without being exposed to the front surface of the display panel, being disposed under the display area of the display panel, and overlapping a first area in the display area.

In a display device according to aspects of the present disclosure, all or part of the first wiring may overlap the first area. A first portion overlapping the first area in the first wiring may comprise: a first semi-transmissive layer positioned over the substrate; a first optical path compensation layer positioned on the first semi-transmissive layer; and a first metal layer positioned on the first optical path compensation layer and including a first metal.

In a display device according to aspects of the present disclosure, the first semi-transmissive layer may have a thickness thinner than a thickness of the first optical path compensation layer.

In a display device according to aspects of the present disclosure, among the first semi-transmissive layer, the first optical path compensation layer and the first metal layer, the thickness of the first semi-transmissive layer closest to the camera is the thinnest, and the thickness of the first metal layer closest to a portion where external light is incident is the thickest.

In a display device according to aspects of the present disclosure, the first semi-transmissive layer may have a thickness of 1 to 5 nm, and the first optical path compensation layer may have a thickness of 30 to 120 nm.

In a display device according to aspects of the present disclosure, an external light is incident on a side opening of the first wiring and reflected from a front surface of the camera. A part of the external light reflected from the front surface of the camera may be reflected from a rear surface of the first semi-transmissive layer. Another part of the external light reflected from the front surface of the camera may pass through the first semi-transmissive layer and the first optical path compensation layer and may be reflected from a rear surface of the first metal layer.

In a display device according to aspects of the present disclosure, the external light reflected from the rear surface of the first semi-transmissive layer and the external light reflected from the rear surface of the first metal layer may have a phase difference by an odd multiple of 180 degrees.

In a display device according to aspects of the present disclosure, the first optical path compensation layer may comprise a conductive transparent material.

In a display device according to aspects of the present disclosure, the display area may comprise the first area and a second area excluding the first area. The first wiring may comprise the first portion overlapping the first area and a second portion overlapping the second area different from the first area. The second portion of the first wiring may comprise the first metal layer, and may not comprise the first semi-transmissive layer and the first optical path compensation layer.

In accordance with an aspect of the present disclosure, there may be provided with a display device, comprising: a display panel including a display area on which an image is displayed, a substrate, and an electrode located over the substrate and disposed in the display area; and a camera photographing the front of the display panel without being exposed to the front surface of the display panel, being disposed under the display area of the display panel, and overlapping a first area in the display area.

In a display device according to aspects of the present disclosure, the electrode may overlap the first area, and the electrode may comprise a semi-transmissive layer positioned over the substrate, an optical path compensation layer positioned on the semi-transmissive layer, and a metal layer positioned on the optical path compensation layer.

In a display device according to aspects of the present disclosure, the semi-transmissive layer may have a thickness thinner than a thickness of the optical path compensation layer.

In a display device according to aspects of the present disclosure, the electrode may be an electrode of a transistor in a subpixel overlapping the first area, or a plate of a capacitor overlapping the first area.

According to aspects of the present disclosure, it is possible to provide a display device in which the camera photographing the front is disposed under the display panel so that the camera is not exposed to the front.

According to aspects of the present disclosure, it is possible to provide a display device capable of acquiring a high quality front image even when the camera photographing the front is disposed under the display panel so that the camera is not exposed to the front.

According to aspects of the present disclosure, it is possible to provide a display device that obtains a high-resolution image by preventing the external light from being repeatedly reflected between the wirings in the display panel and the camera. The external light is light required for front shooting of the camera disposed under the display panel, and is light that enters the interior of the display panel.

BRIEF DESCRIPTION OF THE DRAWINGS

The accompanying drawings, which may be included to provide a further understanding of the disclosure and are incorporated in and constitute a part of the present disclosure, illustrate aspects of the disclosure and together with the description serve to explain various principles of the disclosure.

In the drawings.

DETAILED DESCRIPTION

Figure 1:
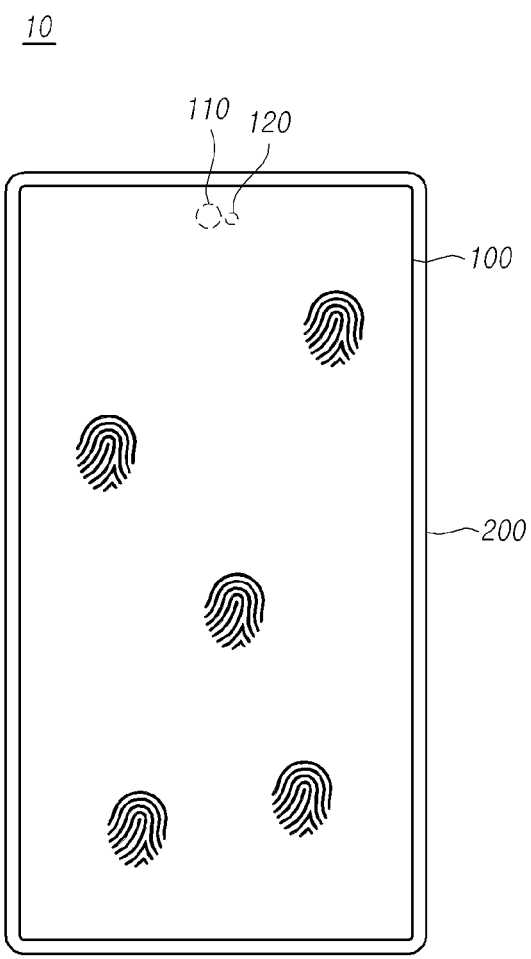
FIG. 1 is a view showing the display device according to aspects of the present disclosure.

Advantages and features of the present disclosure and methods for achieving the advantages or features will be apparent from aspects described below in detail with reference to the accompanying drawings. However, the present disclosure is not limited to the aspects but may be modified in various forms. The aspects are provided merely for completing the disclosure of the disclosure and are provided for completely informing those skilled in the art of the scope of the disclosure. The scope of the disclosure is defined by only the appended claims.

Shapes, sizes, ratios, angles, number of pieces, and the like illustrated in the drawings, which are provided for the purpose of explaining the aspects of the present disclosure, are exemplary and thus the present disclosure is not limited to the illustrated details. In the following description, like elements are referenced by like reference numerals. When it is determined that detailed description of the relevant known functions or configurations involved in the present disclosure makes the gist of the present disclosure obscure, the detailed description thereof will not be made.

When "include," "have," "be constituted," and the like are mentioned in the specification, another element may be added unless "only" is used. A singular expression of an element includes two or more elements unless differently mentioned.

In construing elements, an error range is included even when explicit description is not made.

For example, when positional relationships between two parts are described using 'on,' 'over,' 'under,' 'beside,' and the like, one or more other parts may be disposed between the two parts unless 'just' or 'direct' is used.

In describing temporal relationships, for example, when the temporal order is described using 'after,' 'subsequent,' 'next,' and 'before,' a case which is not continuous may be included unless 'just' or 'direct' is used.

It will be understood that, although the terms "first," "second," and the like may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" may include all possible combinations from one or more related items. For example, "at least one of the first item, the second item, and the third item" may be not only the first item, the second item, or the third item, but also a combination of two or more of the first item, the second item, and the third item.

Each of the features of the various examples in this specification may be partially or totally combined with or combined with each other, technically various interlocking and driving may be possible, and each of the examples may be implemented independently of each other or may be implemented together in an associative relationship.

Hereinafter, an example of a display device according to an exemplary aspect of the present disclosure will be described in detail with reference to the accompanying drawings. In adding reference numerals to the components of each drawing, the same components may have the same reference numerals as possible even though they are displayed on different drawings. In addition, the scale of components shown in the accompanying drawings has a different scale from the actual one for convenience of description, and is not limited to the scale shown in the drawings.

FIG. 1 is a view showing the display device 10 according to aspects of the present disclosure.

The display device 10 according to aspects of the present disclosure may provide a function of displaying an image, a function of sensing a touch using a finger or a pen, and a function of sensing a fingerprint.

Referring to FIG. 1, the display device 10 according to aspects of the present disclosure may include a display panel 100 displaying an image and a case 200 protecting the display panel 100. In FIG. 1, when a user views the front surface of the display device 10, a part of the case 200 may be shown. In some cases, when the display device 10 is implemented in a full-display type, when the user looks at the front of the display device 10, the case 200 may not be visible or almost invisible, and only the display panel 100 may be visible. When the user looks at the front of the display device 10, only the display area of the display panel 100 may be visible. In some cases, the display area and a non-display area outside the display area (also referred to as a bezel) may be viewed together.

Referring to FIG. 1, the display device 10 according to aspects of the present disclosure may sense a touch by a finger or a pen or the like across the entire display area of the display panel 100, and sense a fingerprint across the entire display area of the display panel 100. That is, the display device 10 according to aspects of the present disclosure may provide touch sensing and fingerprint sensing for all areas.

The display device 10 according to aspects of the present disclosure includes an optical device. For example, the optical device may include one or more of a camera 110 for photographing and a proximity sensor 120 for detecting a human body or an object approaching the surroundings. The camera 110 of the present specification may be a front camera that photographs the front surface of the display device 10.

When the display device 10 according to the aspects of the present disclosure is viewed from the front, one or more optical devices of the camera 110 and the proximity sensor 120 are not visible. To this end, the display device 10 according to aspects of the present disclosure has a structure in which one or more optical devices of the camera 110 and the proximity sensor 120 may be positioned under the display panel 100.

In this specification, the camera 110 that is not exposed to the outside and is located under display panel 100 is also referred to as an Under Display Camera (UDC). The display device 10 including the camera 110 is referred to as a camera built-in display.

As described above, although the optical device is located under the display panel 100, the display device 10 according to the aspects of the present disclosure may normally perform a photographing function of the camera 110 and/or a proximity sensing function of the proximity sensor 120 through a unique structure. This will be described in detail below FIG. 2 is a view showing a screen configuration of the display device 10 according to aspects of the present disclosure.

Figure 2:
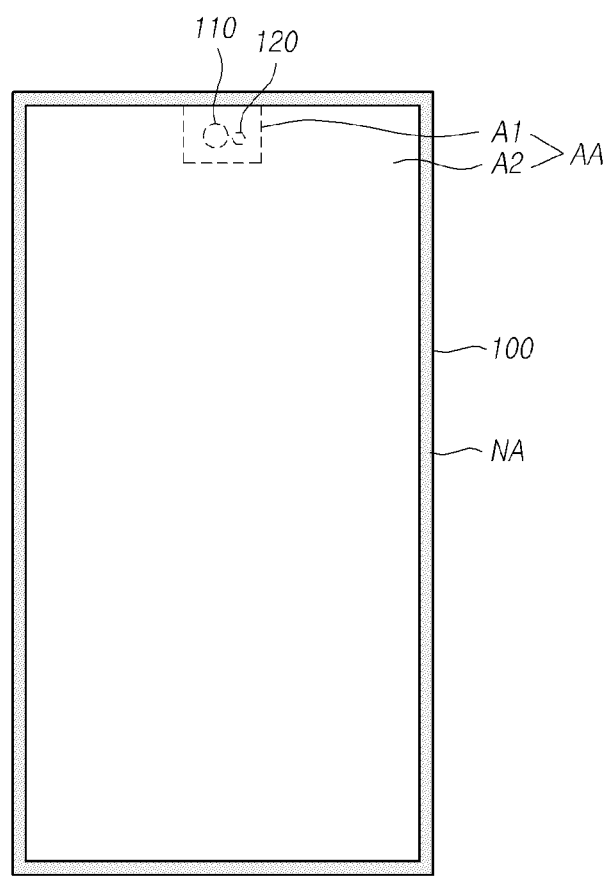
FIG. 2 is a view showing a screen configuration of the display device according to aspects of the present disclosure.

Referring to FIG. 2, the display panel 100 may include a display area AA in which an image is displayed and a non-display area NA which may be an outer area of the display area AA without displaying an image.

Referring to FIG. 2, the display area AA may include a first area A1 and a second area A2. The first area A1 may be a camera area, or may overlap all or part of the camera area or may include a camera area. Here, the camera area may be an area where the lens of the camera 110 is located, and may also be referred to as a camera lens area or a photographing area. In this specification, the camera 110 overlapping the first area A1 may mean a camera lens. The first area A1 may be a proximity sensing area, or may overlap all or part of the proximity sensing area or may include a proximity sensing area. Here, the proximity sensing area may be an area capable of detecting an approach of an object or a human body by the proximity sensor 120.

For example, when a user grasps the display device 10 and photographs himself, the user may shoot while looking at the first area A1. When the user covers the first area A1 with a face or a finger, the display device 10 detects the proximity of the user's face or finger through the proximity sensor 120 and performs a predetermined operation (e.g., screen off, etc.) according to the detection result.

The first area A1 in the display area AA may be a path (Light incident part) through which light enters the optical device. Here, the light may be an electromagnetic form such as visible light, infrared light, or ultraviolet light.

Referring to FIG. 2, one or more optical devices of the camera 110 and the proximity sensor 120 may be located under the first area A1. That is, one or more optical devices of the camera 110 and the proximity sensor 120 may overlap the first area A1.

Figure 3:
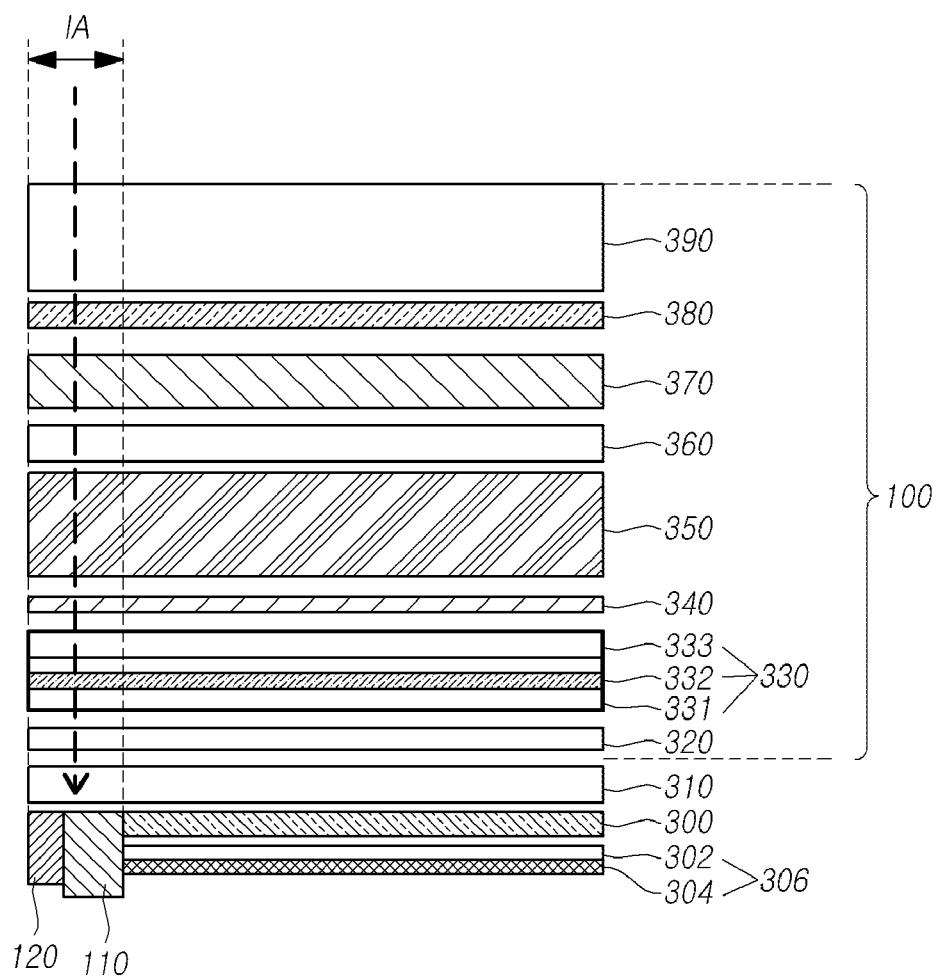
FIG. 3 is a schematic cross-sectional view of the display device according to aspects of the present disclosure.

FIG. 3 is a schematic cross-sectional view of the display device 10 according to aspects of the present disclosure.

Referring to FIG. 3, the display device 10 according to aspects of the present disclosure includes an optical device (e.g., camera 110, proximity sensor 120, etc.) positioned under the display panel 100 and overlapping the display area AA. Nevertheless, the display device 10 according to the aspects of the present disclosure may normally perform an intrinsic function (e.g., shooting function, light receiving function of the proximity sensor 120, etc.) of the optical device, and also perform a display function normally. The display device 10 according to the aspects of the present disclosure has a structure (in particular, the structure in the first area A1) such that the original function of the optical device is normally performed and the display function is also normally performed.

Referring to FIG. 3, the display device 10 according to aspects of the present disclosure has a unique structure in a light incident part IA, which means a space in a panel through which light enters for the function of an optical device. The light incident part IA may be positioned in the display area AA and may overlap with all or part of the first area A1 or may include the first area A1.

Referring to FIG. 3, the display device 10 according to aspects of the present disclosure may include a transparent substrate 320, a subpixel forming unit 330, a heterogeneous cathode electrode layer 340, an encapsulation layer 350, and a touch sensor layer 360. The subpixel forming unit 330 may be positioned over the transparent substrate 320 and may include subpixel patterns formed to form a plurality of subpixels SP. The heterogeneous cathode electrode layer 340 may be positioned on the subpixel forming unit 330 and a cathode voltage corresponding to a common voltage is applied. The encapsulation layer 350 may be disposed on the heterogeneous cathode electrode layer 340 and has an inclined surface at the outer side. The touch sensor layer 360 may be disposed on the encapsulation layer 350 and may include a plurality of touch electrodes.

The subpixel forming unit 330 may include a transistor array 331, an anode electrode layer 332, a light emitting layer 333, and the like. The transistor array 331 may be positioned over the transparent substrate 320 and may be located in the display area AA. The transistor array 331 may include one or more transistors disposed in each of the plurality of subpixels. The anode electrode layer 332 may be disposed on the transistor array 331 and may be disposed on each of a plurality of subpixels and may include an anode electrode electrically connected to a source node or a drain node of the corresponding transistor. The light emitting layer 333 may be positioned on the anode electrode layer 332 and may be positioned on the corresponding anode electrode in each of the plurality of subpixels.

The heterogeneous cathode electrode layer 340 may be positioned on the light emitting layer 333. The anode electrode layer 332, the light emitting layer 333, and the heterogeneous cathode electrode layer 340 form a plurality of light emitting elements (e.g., OLED (Organic Light Emitting Diode), etc.) for each subpixel.

The touch sensor layer 360 may include a plurality of touch electrodes, and may further include a plurality of touch lines electrically connected to all or part of the plurality of touch electrodes.

For example, the plurality of touch electrodes may be disposed on one layer or may be divided and disposed on two or more layers separated by an insulating layer. The plurality of touch lines may be located on a different layer from the plurality of touch electrodes, or may be located on the same layer as some of the plurality of touch electrodes.

The plurality of touch electrodes may be disposed in the display area AA. Each of the plurality of touch lines may electrically connect a corresponding touch electrode positioned in the display area AA and a pad part positioned in the non-display area NA. Accordingly, a plurality of touch lines pass through the non-display area NA. The plurality of touch lines may descend along the inclined surface of the encapsulation layer 350 and be electrically connected to the pad portion.

Referring to FIG. 3, The display device 10 according to aspects of the present disclosure may further include a polarizing plate 370 disposed on the touch sensor layer 360, an optical transparent adhesive 380 disposed on the polarizing plate 370, and a cover glass 390 disposed on the optical transparent adhesive 380.

Referring to FIG. 3, the display panel 100 may include the transparent substrate 320, the subpixel forming unit 330, the heterogeneous cathode electrode layer 340, the encapsulation layer 350, the touch sensor layer 360, the polarizing plate 370, the optical transparent adhesive 380, the cover glass 390 and the like.

Referring to FIG. 3, the display device 10 according to aspects of the present disclosure may further include a fingerprint sensor panel 300 positioned under the display panel 100. That is, the fingerprint sensor panel 300 may be located under the transparent substrate 320.

Referring to FIG. 3, when present in the air layer between the display panel 100 and the fingerprint sensor panel 300, the fingerprint sensing performance through the fingerprint sensor panel 300 may deteriorate or the fingerprint sensing itself may not be possible. Accordingly, the display panel 100 and the fingerprint sensor panel 300 may be bonded with a bonding material so that the air layer does not exist between the display panel 100 and the fingerprint sensor panel 300. For example, the bonding material may include resin, optical clear adhesive OCA, pressure sensitive adhesive PSA, or the like.

Referring to FIG. 3, the display device 10 according to aspects of the present disclosure may further include a back plate 310 positioned between the display panel 100 and the fingerprint sensor panel 300. The display panel 100 may be bonded to the top surface of the back plate 310, and the fingerprint sensor panel 300 may be bonded to the bottom surface of the back plate 310. Here, the back plate 310 may not be an essential configuration.

Referring to FIG. 3, the display device 10 according to aspects of the present disclosure further may include a cushion plate 306 positioned under the fingerprint sensor panel 300 and protecting a lower portion of the fingerprint sensor panel 300. The cushion plate 306 may include a foam pad 302 and a metal plate 304 made of copper (Cu) or the like.

Referring to FIG. 3, the display device 10 according to aspects of the present disclosure includes the optical device positioned in the display area AA and disposed under the transparent substrate 320. For example, the optical device may include one or more of the camera 110 and the proximity sensor 120.

Referring to FIG. 3, the camera 110 and the proximity sensor 120 may be located in the first area A1 in the display area AA. That is, the camera 110 and the proximity sensor 120 may overlap the first area A1 in the display area AA.

Referring to FIG. 3, the light incident part IA may be a light path. More specifically, the light incident part IA may be a path through which light (e.g., visible light) for photographing of the camera 110 enters or exits, and light (e.g., infrared) for sensing by the proximity sensor 120 enters and exits. On a plane, the light incident part IA may correspond to the first area A1 or may be included in the first area A1. When viewed vertically, the light incident part IA may be an area from the cover class 390 corresponding to the front surface of the display device 10 to the optical device.

The first area A1 may be a camera area (camera lens area) in which the lens of the camera 110 for photographing may be located, and may be a proximity sensing area capable of sensing an approach of an object or a human body.

Since the first area A1 may be the light incident part IA, light must be well transmitted through the first area A1.

To this end, each of the layers 390, 380, 370, 360, 350, 340, 330, and 310 located in the light incident part IA, which may be the light incident path, may have a transmittance of more than a predetermined threshold transmittance. All or part (corresponding to the first area A1) of each of the layers 390, 380, 370, 360, 350, 340, 330, and 310 positioned in the light incident part IA may have a transmittance equal to or greater than the predetermined threshold transmittance. The predetermined threshold transmittance may be a minimum transmittance value that enables each function of the camera 110 and the proximity sensor 120. In this specification, the term "transmittance" is also referred to as "transparency". This will be described in more detail below.

Meanwhile, as illustrated in FIG. 2, the first area A1 may be located in the display area AA, and may be located outside the display area AA. Alternatively, the first area A1 may be located in the display area AA, and may be located in the center of the display area AA. The first area A1 may have a predetermined shape (e.g., polygons such as squares, hexagons, rounds, ovals, etc.) when viewed from over.

Figure 4:
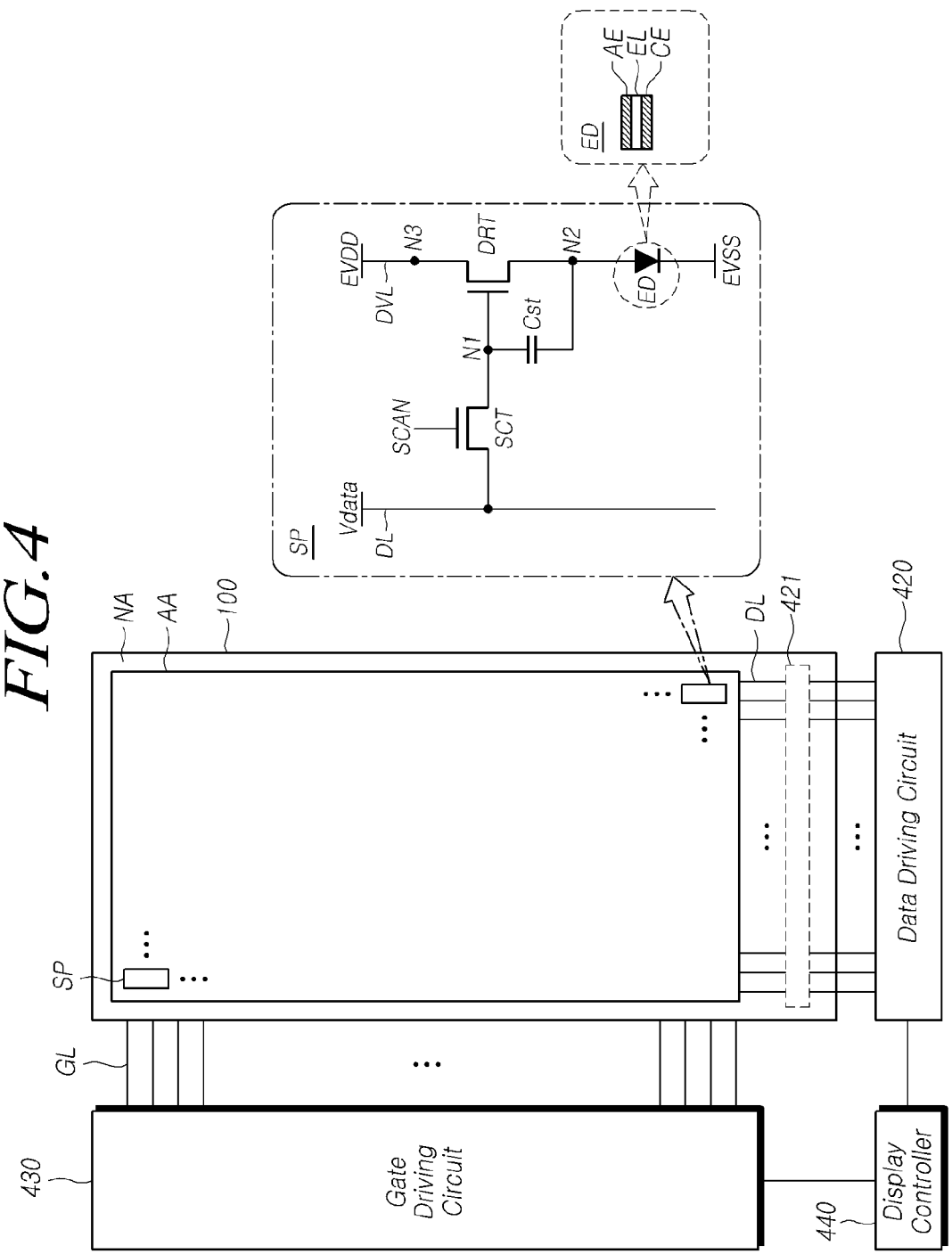
FIG. 4 is a configuration diagram of a display part of the display device according to aspects of the present disclosure.

FIG. 4 is a configuration diagram of a display part of the display device 10 according to aspects of the present disclosure.

Referring to FIG. 4, a display part of the display device 10 according to aspects of the present disclosure may include a display panel 100 in which a plurality of data lines DL, a plurality of gate lines GL, and a plurality of subpixel SP may be disposed, a data driving circuit 420 for driving the plurality of data lines DL, a gate driving circuit 430 for driving the plurality of gate lines GL, and a display controller 440 for controlling the operation of the data driving circuit 420 and the gate driving circuit 430.

The data driving circuit 420 may supply the image data voltage Vdata to the plurality of data lines DL according to the timing control of the display controller 440. The gate driving circuit 430 may sequentially supply the scan signals SCAN to the plurality of gate lines GL according to the timing control of the display controller 440.

The plurality of data lines DL disposed in the display area AA of the display panel 100 are electrically connected to the display pad unit 421 located in the non-display area NA of the display panel 100. The data driving circuit 420 is electrically connected to the display pad unit 421.

The data driving circuit 420 may be implemented with a chip on film (COF) type, and may be mounted on a circuit film bonded to the display pad unit 421 of the display panel 100. Alternatively, the data driving circuit 420 may be implemented in a COG (Chip On Glass) type or a COP (Chip On Panel) type, and may be directly mounted on the display pad unit 421 of the display panel 100.

The gate driving circuit 430 may be implemented in a COF (Chip On Film) type, and may be mounted on a circuit film electrically connected to the display panel 100. Alternatively, the gate driving circuit 430 may be implemented in a COG (Chip On Glass) type or a COP (Chip On Panel) type, and may be mounted on the non-display area NA of the display panel 100. Alternatively, the gate driving circuit 430 may be implemented in a GIP (Gate In Panel) type to be formed in the non-display area NA of the display panel 100.

The display device 10 according to aspects of the present disclosure may be a liquid crystal display (LCD) including a backlight unit. Alternatively, the display device 10 according to aspects of the present disclosure may be a self-luminous display such as an organic light emitting diode (OLED) display, a quantum dot display, or a micro light emitting diode (μLED) display.

When the display device 10 according to the aspects of the present disclosure may be an OLED display, each subpixel SP may include an organic light emitting diode (OLED) that emits light as a light emitting device. When the display device 10 according to the present exemplary aspects may be a quantum dot display, each subpixel SP may include a light emitting device made of quantum dots, which may be semiconductor crystals that emit light themselves. When the display device 10 according to the present aspects may be a micro LED display, each sub-pixel SP emits light itself and may include a micro LED (Micro Light Emitting Diode) made of an inorganic material as a light emitting device.

In the display device 10 according to aspects of the present disclosure, each subpixel SP may include a light-Emitting Element ED, a driving transistor DRT for controlling the current flowing through the light emitting element ED, a scan transistor SCT for transferring the image data voltage Vdata to the driving transistor DRT, and a storage capacitor Cst for maintaining voltage for a certain period, and the like.

The light emitting device ED may include an anode electrode AE and a cathode electrode CE, and a light emitting layer EL positioned between the anode electrode AE and the cathode electrode EC. For example, the light emitting device ED may be an organic light emitting diode (OLED), a light emitting diode (LED), a quantum dot light emitting device, or the like.

The cathode electrode CE of the light emitting element ED may be a common electrode. In this case, a base voltage EVSS may be applied to the cathode electrode CE of the light emitting element ED. Here, for example, the ground voltage EVSS may be a ground voltage or a voltage similar to the ground voltage.

The driving transistor DRT is a transistor for driving the light emitting element ED, and may include a first node N1, a second node N2, and a third node N3.

The first node N1 of the driving transistor DRT may be a gate node of the driving transistor DRT, and may be electrically connected to a source node or a drain node of the scan transistor SCT. The second node N2 of the driving transistor DRT may be electrically connected to the anode electrode AE of the light emitting element ED, and may be a source node or a drain node of the driving transistor DRT. The third node N3 of the driving transistor DRT may be electrically connected to a driving voltage line DVL that supplies the driving voltage EVDD, and may be a drain node or a source node of the driving transistor DRT.

The scan transistor SCT may control the connection between the first node N1 of the driving transistor DRT and the corresponding data line DL in response to the scan signal SCAN supplied from the gate line GL.

The drain node or the source node of the scan transistor SCT may be electrically connected to the corresponding data line DL. The source node or the drain node of the scan transistor SCT may be electrically connected to the first node N1 of the driving transistor DRT. The gate node of the scan transistor SCT may be electrically connected to the gate line GL to receive a scan signal SCAN through the gate line GL.

When the scan transistor SCT is turned on by the scan signal SCAN of the turn-on level voltage, the scan transistor SCT may transfer the image data voltage Vdata supplied from the corresponding data line DL to the first node N1 of the driving transistor DRT.

The scan transistor SCT is turned on by the scan signal SCAN of the turn-on level voltage, and is turned off by the scan signal SCAN of the turn-off level voltage. Here, when the scan transistor SCT is n-type, the turn-on level voltage may be a high level voltage, and the turn-off level voltage may be a low level voltage. When the scan transistor SCT is p-type, the turn-on level voltage may be a low level voltage and the turn-off level voltage may be a high level voltage.

The storage capacitor Cst may be electrically connected between the first node N1 and the second node N2 of the driving transistor DRT. The storage capacitor Cst may maintain the image data voltage Vdata corresponding to the image signal voltage or a voltage corresponding thereto for one frame time.

The storage capacitor Cst is an intentionally designed external capacitor, not a parasitic capacitor that is an internal capacitor (e.g., Cgs, Cgd) existing between the first node N1 and the second node N2 of the driving transistor DRT.

Each of the driving transistor DRT and the scan transistor SCT may be an n-type transistor or a p-type transistor. Both the driving transistor DRT and the scan transistor SCT may be n-type transistors or p-type transistors. At least one of the driving transistor DRT and the scan transistor SCT may be an n-type transistor (or p-type transistor) and the other may be a p-type transistor (or n-type transistor).

Each subpixel structure illustrated in FIG. 4 is only an example for description. Each subpixel may further include one or more transistors and/or one or more capacitors. Each of the plurality of sub-pixels may have the same structure, or some of the plurality of sub-pixels may have a different structure.

Figure 5:
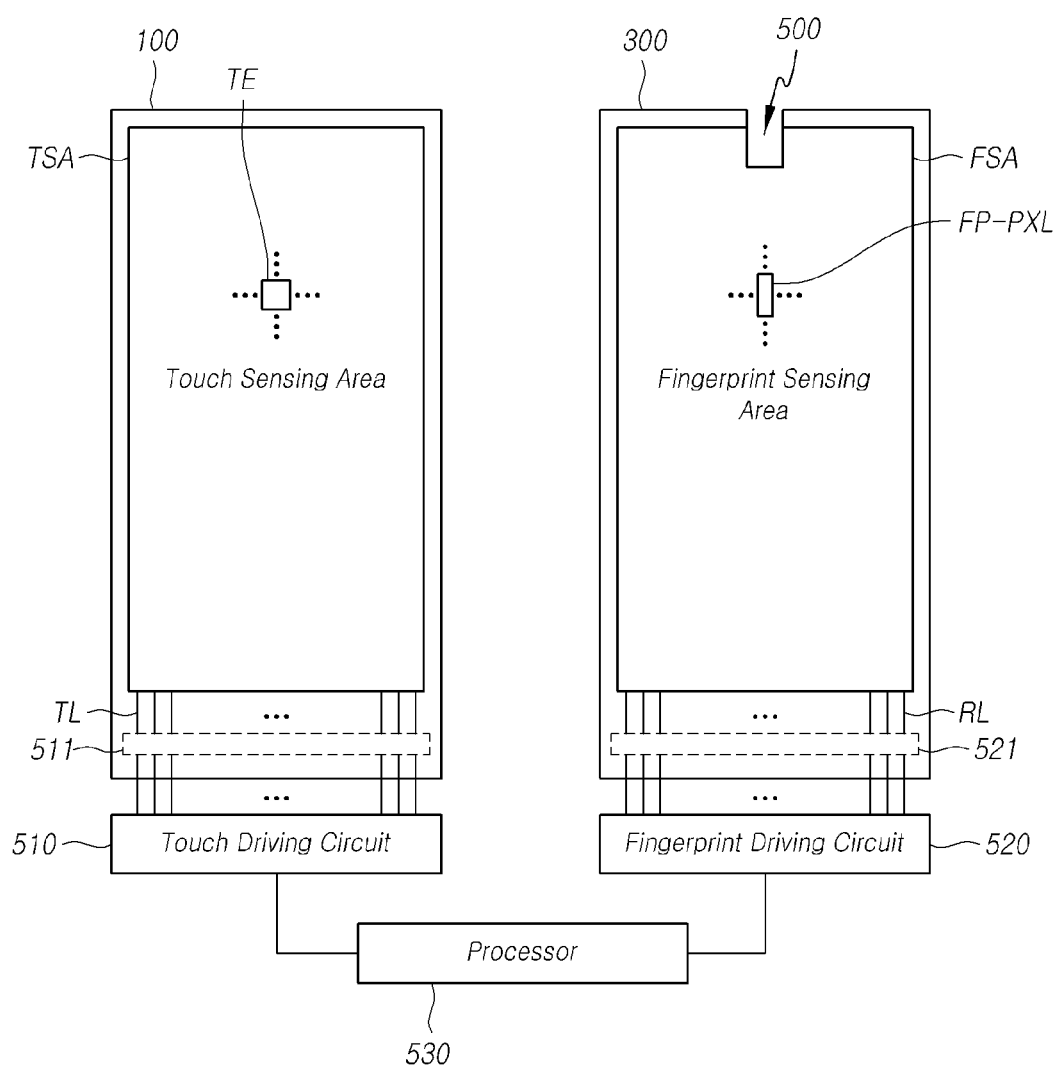
FIG. 5 is a configuration diagram of a touch sensing part and a fingerprint sensing part of the display device according to aspects of the present disclosure.

FIG. 5 is a configuration diagram of a touch sensing part and a fingerprint sensing part of the display device 10 according to aspects of the present disclosure.

Referring to FIG. 5, the display device 10 according to aspects of the present disclosure may include a touch sensing part that senses a touch caused by a touch pointer or senses a touch position where the touch pointer touches the display panel 100. Here, the touch pointer may be a finger or a pen. When the touch pointer touches the display panel 110, the touch pointer may touch the display panel 110 in a contact manner, or the touch pointer may touch the display panel 110 in a non-contact manner (also called hover mode method). The touch sensing part may include the display panel 100 with touch sensors, a touch driving circuit 510 driving and sensing a touch sensor to output touch sensing data, and a processor 530 that recognizes a touch event or acquires a touch position using touch sensing data.

The touch sensor embedded in the display panel 100 may include a plurality of touch electrodes TE disposed in the touch sensing area TSA of the display panel 100. Here, the touch sensing area TSA may correspond to the display area AA.

The display panel 100 may include a plurality of touch electrodes TE and a plurality of touch lines TL. The display panel 100 may further include a touch pad unit 511 disposed in the non-display area NA and electrically connected to the touch driving circuit 510. Each of the plurality of touch lines TL may electrically connect the corresponding touch electrode TE among the plurality of touch electrodes TE to the touch pad unit 511.

The touch pad unit 511 may be positioned on the transparent substrate 320 and may be located in the non-display area NA, which may be an outer area of the display area AA. The plurality of touch lines TL may be electrically connected to all or part of the plurality of touch electrodes TE. The plurality of touch lines TL may descend along the inclined surface of the encapsulation layer 350 and be electrically connected to the touch pad unit 511.

The touch driving circuit 510 may drive all or part of the plurality of touch electrodes TE and sense all or part of the plurality of touch electrodes TE to generate touch sensing data. The touch driving circuit 510 may supply the generated touch sensing data to the processor 530.

The processor 530 may recognize a touch occurrence or determine a touch location based on the touch sensing data. The processor 530 may perform a predetermined function (e.g., input processing, object selection processing, writing processing, etc.) based on the recognized touch occurrence or the determined touch position.

The touch driving circuit 510 and the data driving circuit 420 may be implemented as separate integrated circuits. Alternatively, the touch driving circuit 510 and the data driving circuit 420 may be integrated into one integrated circuit.

Referring to FIG. 5, a fingerprint sensing part of the display device 10 according to aspects of the present disclosure is a part for sensing a user's fingerprint. The fingerprint sensing part may include a fingerprint sensor panel 300 in which a plurality of fingerprint sensing pixels FP-PXL may be arranged, a fingerprint driving circuit 520 driving and sensing the fingerprint sensor panel 300 to output fingerprint sensing data, and a processor 530 recognizing a fingerprint using fingerprint sensing data and performing a predetermined function (e.g., user authentication) according to a fingerprint recognition result.

The fingerprint sensing part of the display device 10 according to aspects of the present disclosure may sense a fingerprint by an optical method, an ultrasonic method, or the like. In the following, the fingerprint sensing part of the display device 10 may be an example of sensing a fingerprint by an ultrasonic method.

The fingerprint sensing pixels FP-PXL included in the fingerprint sensor panel 300 may be disposed in the fingerprint sensing area FSA. Here, the fingerprint sensing area FSA may correspond to the display area AA.

Each of the plurality of fingerprint sensing pixels FP-PXL may include a piezoelectric element, a driving unit (transmission unit), and a sensing unit (reception unit). The piezoelectric element may include a driving electrode, a piezoelectric material layer, and a common electrode. The driving unit drives the piezoelectric element to generate ultrasonic waves in the piezoelectric element. The ultrasonic waves generated by the piezoelectric element may be reflected from the fingerprint portion (ridge, valley) of the finger. The ultrasonic reflection characteristics at the ridge and the ultrasonic reflection characteristics at the valley may be different. The sensing unit generates a signal according to the ultrasound waves reflected from the fingerprint portion of the finger, and senses the generated signal. Here, each of the driving unit (transmission unit) and the sensing unit (reception unit) may include one or more switching elements (transistors).

A signal (AC signal) having a variable voltage level may be applied to one of the driving electrode and a common electrode, and a signal (DC signal) having a constant voltage level may be applied to the other.

A fingerprint pad unit 521 to which the fingerprint driving circuit 520 may be electrically connected may exist on the outer side of the fingerprint sensing area FSA of the fingerprint sensor panel 300.

The fingerprint sensor panel 300 may include a plurality of read-out lines RL that electrically connect each sensing unit (reception unit) of the plurality of fingerprint sensing pixels FP-PXL to the fingerprint pad unit 521.

The fingerprint driving circuit 520 may drive all or part of the plurality of fingerprint sensing pixels FP-PXL and sense all or part of the plurality of fingerprint sensing pixels FP-PXL. The fingerprint driving circuit 520 may generate fingerprint sensing data according to the sensing result, and supply the generated fingerprint sensing data to the processor 530.

The processor 530 may recognize the fingerprint based on the fingerprint sensing data, and perform a predetermined function (e.g., user authentication, etc.) according to the fingerprint recognition result.

Meanwhile, referring to FIG. 5, the fingerprint sensor panel 300 may have a hole or notch groove 500 in a portion corresponding to the first area A1.

Hereinafter, the structure of the touch sensor in the display panel 100 will be described with reference to FIGS. 6 to 10. The display device 10 according to aspects of the present disclosure may sense a touch in a capacitance method.

Figure 6:
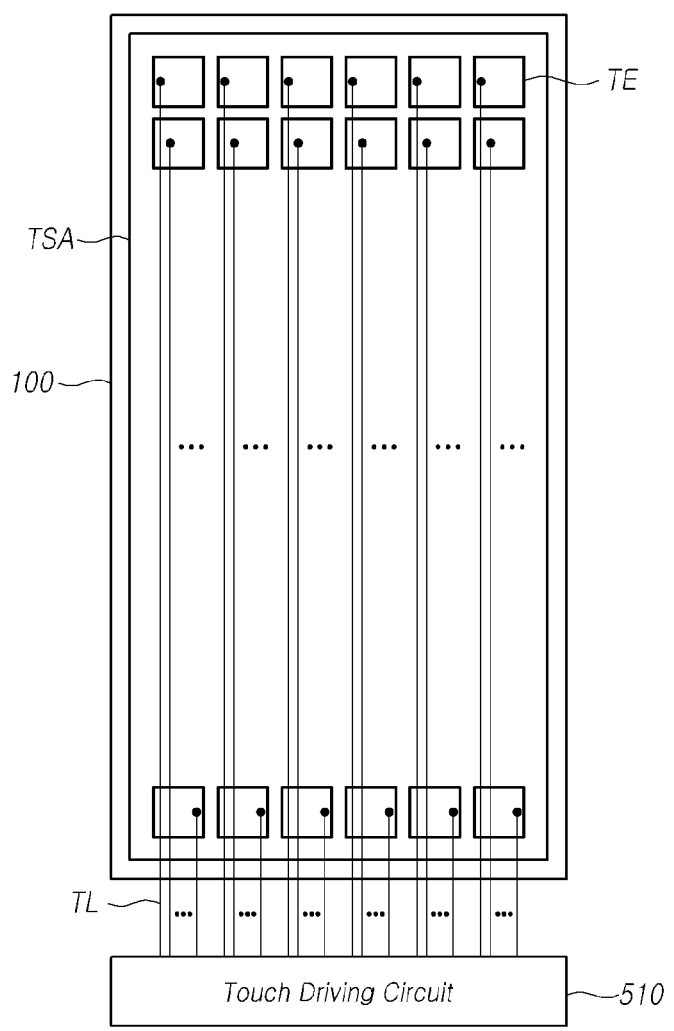
FIG. 6 is an exemplary view illustrating a structure of the touch sensor in the display panel of the display device according to aspects of the present disclosure.

FIG. 6 is an exemplary view illustrating a structure of the touch sensor in the display panel 100 of the display device 10 according to aspects of the present disclosure.

Referring to FIG. 6, each of the plurality of touch electrodes TE disposed in the touch sensing area TSA of the display panel 100 may be separated from each other and may be a block electrode. Each of the plurality of touch electrodes TE may not overlap each other.

Each of the plurality of touch electrodes TE may be electrically connected to the touch driving circuit 510 through one or more touch lines TL.

The touch line TL may be disposed in parallel with the data line DL or in the same direction as the data line DL.

The plurality of touch electrodes TE may include first and second touch electrodes arranged in the same column. The first touch electrode may be located farther from the touch driving circuit 510 than the second touch electrode. The plurality of touch lines TL may include a first touch line connected to the first touch electrode and a second touch line connected to the second touch electrode.

The first touch line connected to the first touch electrode may overlap the second touch electrode, but may not be electrically connected to the second touch electrode.

The first touch electrode and the second touch electrode may be separated in the display panel 100 and may be physically separated. The first touch line and the second touch line may be separated within the display panel 100 and may be physically separated. The first touch electrode and the second touch electrode may be separated in the display panel 100, but may be electrically connected by a switching circuit in the touch driving circuit 510 depending on driving conditions.

The touch sensor structure illustrated in FIG. 6 may be suitable for a self-capacitance based touch sensing method that senses a touch using a capacitance between a touch electrode TE and a touch pointer (e.g., finger, pen, etc.).

Accordingly, the touch driving circuit 510 supplies a touch driving signal to one or more of the plurality of touch electrodes TE, and detects a touch sensing signal from the touch electrode TE to which the touch driving signal may be applied. The touch driving circuit 510 may acquire a sensing value for each touch electrode TE based on the detection of the touch sensing signal, and generate touch sensing data including the obtained sensing value.

Figure 7:
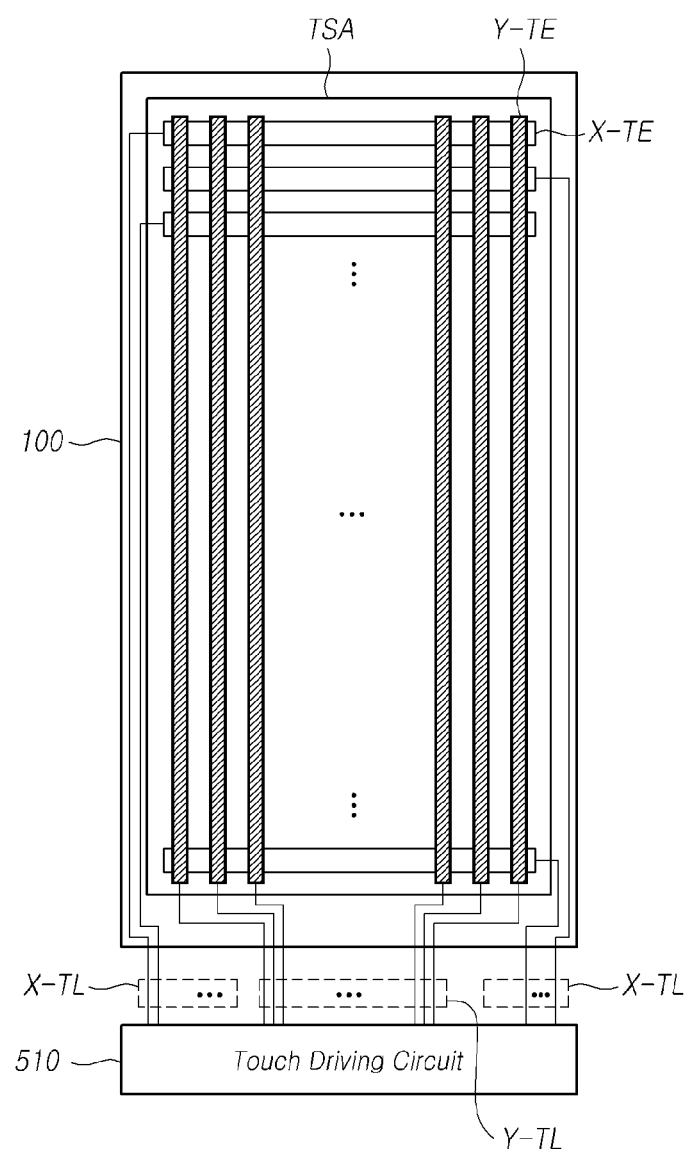
FIG. 7 is another exemplary view of a structure of the touch sensor in the display panel of the display device according to aspects of the present disclosure.

FIG. 7 is another exemplary view of a structure of the touch sensor in the display panel 100 of the display device 10 according to aspects of the present disclosure.

The touch sensor structure illustrated in FIG. 7 may be suitable for a mutual-capacitance-based touch sensing method that senses a touch using a capacitance between two touch electrodes TE.

Referring to FIG. 7, for a touch sensing method based on mutual-capacitance, the plurality of touch electrodes TE disposed in the touch sensing area TSA of the display panel 100 may include a plurality of first touch electrodes X-TE and a plurality of second touch electrodes Y-TE. The plurality of first touch electrodes X-TE and the plurality of second touch electrodes Y-TE may be disposed in different directions. Mutual-capacitance may be formed between the first touch electrode X-TE and the second touch electrode Y-TE.

The plurality of first touch electrodes X-TE and the plurality of second touch electrodes Y-TE may cross each other. The point (area) at which the first touch electrode X-TE and the second touch electrode Y-TE intersect each other may be called a touch node.

The plurality of first touch electrodes X-TE may be driving electrodes (or transmitting electrodes) to which a touch driving signal is supplied from the touch driving circuit 510, and the plurality of second touch electrodes Y-TE may be sensing electrodes (or receiving electrodes) sensed by the touch driving circuit 510.

On the contrary, the plurality of first touch electrodes X-TE may be sensing electrodes (or receiving electrodes) sensed by the touch driving circuit 510, and the plurality of second touch electrodes Y-TE may be driving electrodes (or transmitting electrodes) to which a touch driving signal is supplied from the touch driving circuit 510.

Figure 8:
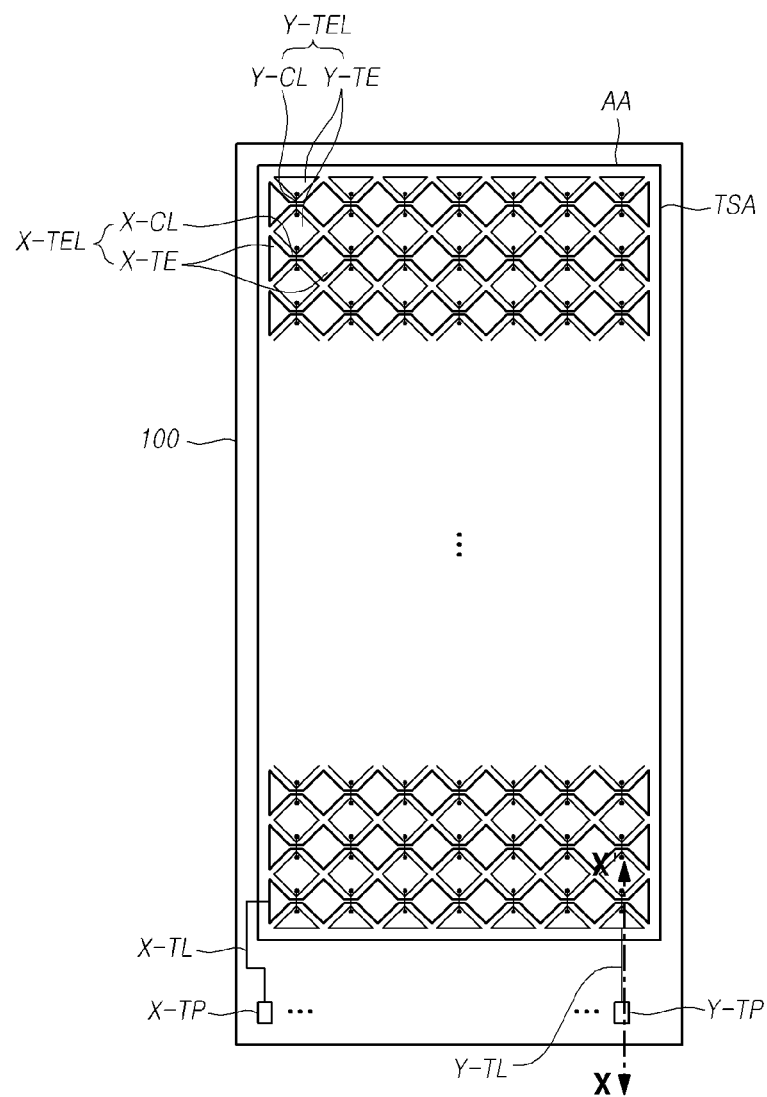
FIG. 8 is another exemplary view of a structure of the touch sensor in the display panel of the display device according to aspects of the present disclosure.

FIG. 8 is another exemplary view of a structure of the touch sensor in the display panel 100 of the display device 10 according to aspects of the present disclosure.

FIG. 8 is a touch sensor structure for mutual-capacitance based touch sensing and is an example different from FIG. 7. However, the touch sensor structure of FIG. 8 is an electrical equivalent structure to the touch sensor structure of FIG. 7.

Referring to FIG. 8, the plurality of touch electrodes TE disposed in the touch sensing area TSA of the display panel 100 may include a plurality of first touch electrodes X-TE and a plurality of second touch electrodes Y-TE. The first touch electrodes X-TE disposed in the same row among the plurality of first touch electrodes X-TE may be electrically connected by the first bridge pattern X-CL. The second touch electrodes Y-TE disposed in the same column among the plurality of second touch electrodes Y-TE may be electrically connected by the second bridge pattern Y-CL.

The first touch electrodes X-TE disposed in the same row and positioned on the same layer and the first bridge pattern X-CL connecting them may be all integrally formed and may be located on the same layer.

The second touch electrodes Y-TE disposed in the same column and positioned on the same layer, and the second bridge pattern Y-CL connecting them, may be located on different layers and may be electrically connected through contact holes.

The first touch electrodes X-TE disposed in the same row and electrically connected by the first bridge pattern X-CL form one first touch electrode line X-TEL. The first touch electrode line X-TEL formed in this way may be electrically the same as the first touch electrode X-TE in FIG. 7. The second touch electrodes Y-TE disposed in the same column and electrically connected by the second bridge pattern Y-CL form one second touch electrode line Y-TEL. The second touch electrode line Y-TEL formed as described above may be electrically the same as the second touch electrode Y-TE in FIG. 7.

Each of the plurality of first touch electrode lines X-TEL may be electrically connected to one or more first touch lines X-TL. Each of the plurality of second touch electrode lines Y-TEL may be electrically connected to one or more second touch lines Y-TL.

Each of the plurality of first touch electrode lines X-TEL may be electrically connected to the first touch pad X-TP included in the touch pad unit 510 through one or more first touch lines X-TL. Each of the plurality of second touch electrode lines Y-TEL may be electrically connected to the second touch pad Y-TP included in the touch pad unit 510 through one or more second touch lines Y-TL.

Figure 9:
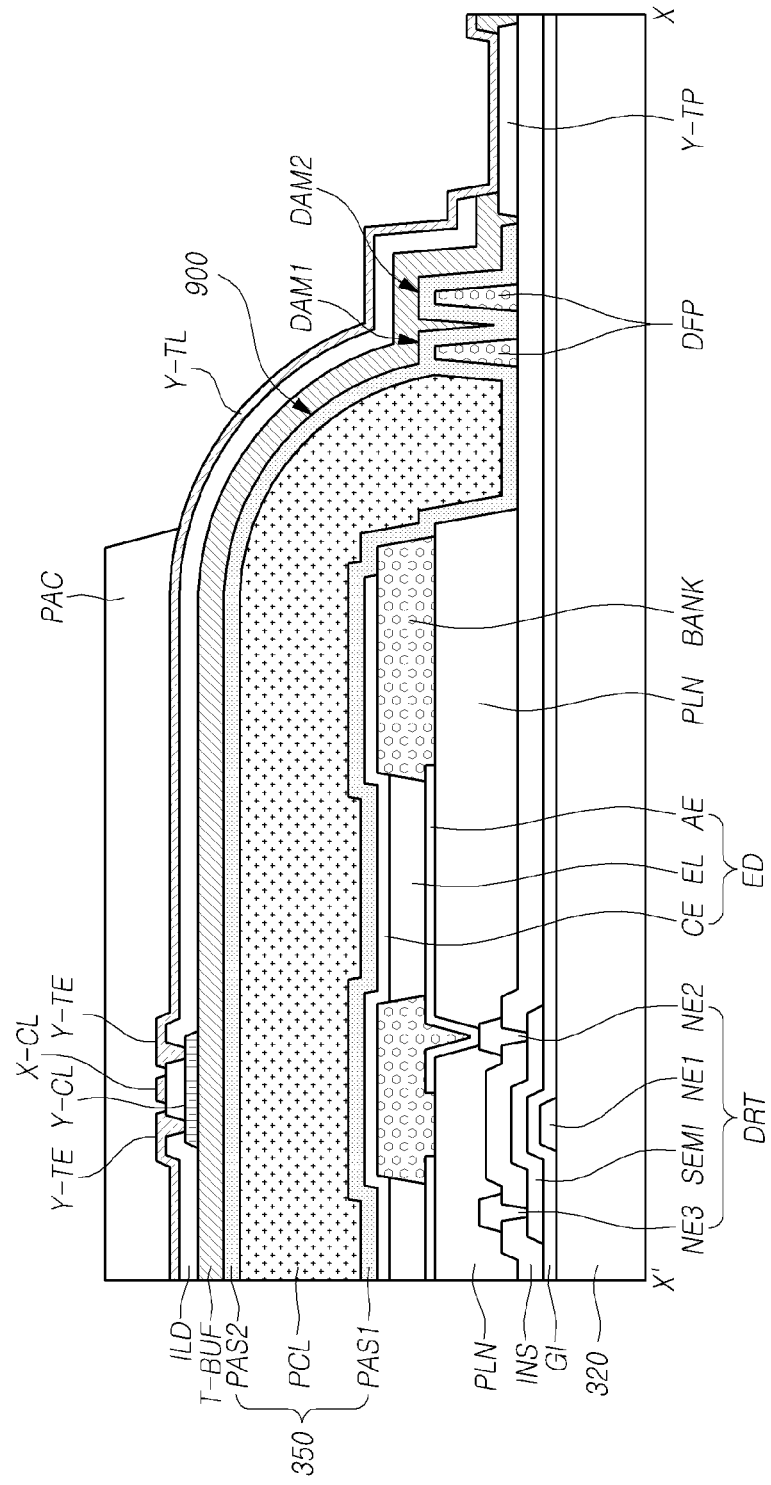
FIG. 9 is a cross-sectional view of the display panel of the display device according to aspects of the present disclosure.

FIG. 9 is a cross-sectional view of the display panel 100 of the display device 10 according to aspects of the present disclosure.

The driving transistor DRT in each subpixel SP in the display area AA may be disposed over the transparent substrate 320.

The driving transistor DRT may include a first node electrode NE1 corresponding to a gate electrode, a second node electrode NE2 corresponding to a source electrode or a drain electrode, and a third node electrode NE3 corresponding to a drain electrode or a source electrode. The driving transistor DRT further may include a semiconductor layer SEMI or the like.

The gate insulating layer GI may be positioned between the first node electrode NE1 and the semiconductor layer SEMI. The first node electrode NE1 and the semiconductor layer SEMI may overlap each other. The second node electrode NE2 may be formed on the insulating layer INS and may be connected to one side of the semiconductor layer SEMI through a contact hole. The third node electrode NE3 may be formed on the insulating layer INS and may be connected to the other side of the semiconductor layer SEMI through a contact hole.

The light emitting element ED may include the anode electrode AE corresponding to the pixel electrode, the light emitting layer EL formed on the anode electrode AE, and the cathode electrode CE formed on the emission layer EL and corresponding to the common electrode.

The anode electrode AE may be electrically connected to the second node electrode NE2 of the driving transistor DRT exposed through the pixel contact hole passing through the planarization layer PLN.

The emission layer EL may be formed on the anode electrode AE of the emission area provided (exposed) by the bank BANK. The light emitting layer EL may have a stack structure including a hole related layer, a light emitting layer, and an electron related layer. The cathode electrode CE may be formed to face the anode electrode AE with the light emitting layer EL interposed therebetween.

The light emitting element ED may be vulnerable to moisture or oxygen. The encapsulation layer 350 may prevent the light emitting device ED from being exposed to moisture or oxygen. That is, the encapsulation layer 350 may prevent the penetration of moisture or oxygen. The encapsulation layer 350 may be a single layer, but may be composed of a plurality of layers (PAS1, PCL, and PAS2) as shown in FIG. 9.

For example, when the encapsulation layer 350 is composed of a plurality of layers (PAS1, PCL, PAS2), the encapsulation layer 350 may include at least one inorganic encapsulation layer (PAS1, PAS2) and at least one organic encapsulation layer PCL. As a specific example, the encapsulation layer 350 may have a structure in which the first inorganic encapsulation layer PAS1, the organic encapsulation layer PCL, and the second inorganic encapsulation layer PAS2 may be sequentially stacked.

Here, the organic encapsulation layer PCL may further include at least one organic encapsulation layer or at least one inorganic encapsulation layer.

The first inorganic encapsulation layer PAS1 may be disposed on the cathode electrode CE and may be disposed closest to the light emitting element ED. The first inorganic encapsulation layer PAS1 may be formed of an inorganic insulating material capable of low-temperature deposition. For example, the first inorganic encapsulation layer PAS1 may be silicon nitride ($SiN_x$), silicon oxide ($SiO_x$), silicon oxynitride (SiON), or aluminum oxide ($Al_2O_3$). Since the first inorganic encapsulation layer PAS1 may be deposited in a low temperature atmosphere, during the deposition process, the first inorganic encapsulation layer PAS1 may prevent the light emitting layer EL including the organic material vulnerable to a high temperature atmosphere from being damaged.

The organic encapsulation layer PCL may be formed with a smaller area than the first inorganic encapsulation layer PAS1. In this case, the organic encapsulation layer PCL may be formed to expose both ends of the first inorganic encapsulation layer PAS1. The organic encapsulation layer PCL may serve as a buffer for alleviating stress between layers due to bending of the touch display device, which is an organic light emitting display device, and may also serve to enhance flattening performance. For example, the organic encapsulation layer PCL may be acrylic resin, epoxy resin, polyimide, polyethylene, or silicon oxycarbon (SiOC), and may be formed of an organic insulating material. For example, the organic encapsulation layer PCL may be formed through an inkjet method.

The display panel 100 may further include one or more dams (DAM1, DMA2) formed to prevent the encapsulation layer 350 from collapsing.

The one or more dams DAM1 and DMA2 may exist at or near the boundary of the display area AA and the non-display area NA. For example, the one or more dams DAM1 and DMA2 may be located at or near the end point of the slope 900 of the encapsulation layer 350.

One or more dams DAM1 and DMA2 may be disposed between the touch pad unit 511 including the touch pad Y-TP and the display area AA. The one or more dams DAM1 and DMA2 may be formed of a dam forming pattern DFP or the like. For example, the dam forming pattern DFP may include the same material as the bank BANK.

The one or more dams DAM1 and DMA2 may be located only in the non-display area NA. Alternatively, most of the one or more dams DAM1 and DMA2 exist in the non-display area NA, but a portion of the one or more dams DAM1 and DMA2 may span the display area AA.

When the display panel 100 is formed with two or more dams (DAM1, DMA2) to prevent the sealing layer 350 from collapsing, the dam located closest to the display area AA may be called the primary dam DAM1. After the primary dam, a dam located close to the display area AA may be called a secondary dam DAM2. The primary dam DAM1 may be positioned relatively closer to the display area AA than the secondary dam DAM2. The secondary dam DAM2 may be positioned relatively closer to the touch pad unit 511 than the primary dam DAM1.

When the liquid form organic encapsulation layer PCL is dropped on the display area AA, the liquid form organic encapsulation layer PCL may collapse in the direction of the non-display area NA. The collapsed organic encapsulation layer PCL may invade the pad area and cover the touch pad unit 511 or the like. The collapse of the organic encapsulation layer PCL may be prevented by one or more dams (DAM1, DMA2). This may be larger when two or more dams DAM1 and DAM2 may be formed, as illustrated in FIG. 9.

The primary dam DAM1 and/or the secondary dam DAM2 may be formed in a single layer or multi-layer structure.

The primary dam DAM1 and/or the secondary dam DAM2 may be basically made of a dam forming pattern DFP. The dam forming pattern DFP may have a higher height than the touch pad Y-TP disposed on the touch pad unit 511.

The dam formation pattern DFP may be formed of the same material as the bank BANK for separating the subpixels SP from each other, or may be formed of the same material as a spacer for maintaining the interlayer spacing. In this case, the dam formation pattern DFP may be formed simultaneously with a bank BANK or a spacer. Accordingly, a dam structure may be formed without an additional mask and cost increase.

Referring to FIG. 9, The primary dam DAM1 and/or the secondary dam DAM2 has a multi-layer structure in which the first inorganic encapsulation layer PAS1 and/or the second inorganic encapsulation layer PAS2 may be stacked on the dam formation pattern DFP.

The organic encapsulation layer PCL containing the organic material may be located only on the inner side of the innermost primary dam DAM1. That is, the organic encapsulation layer PCL may not be present on all dams DAM1 and DAM2. Alternatively, the organic encapsulation layer PCL including an organic material may be positioned on at least the primary dam DAM1 of the primary dam DAM1 and the secondary dam DAM2. That is, the organic encapsulation layer PCL may be located extending to only the upper portion of the primary dam DAM1. Alternatively, the organic encapsulation layer PCL may be positioned to extend beyond the upper portion of the primary dam DAM1 to the upper portion of the secondary dam DAM2.

The second inorganic encapsulation layer PAS2 may be formed to cover the top and side surfaces of the organic encapsulation layer PCL and the first inorganic encapsulation layer PAS1 on the transparent substrate 320 on which the organic encapsulation layer PCL may be formed. The second inorganic encapsulation layer PAS2 may minimize or block external moisture or oxygen from penetrating into the first inorganic encapsulation layer PAS1 and the organic encapsulation layer PCL. For example, the second inorganic encapsulation layer PAS2 may be formed of an inorganic insulating material such as silicon nitride ($SiN_x$) silicon oxide ($SiO_x$), silicon oxynitride (SiON), or aluminum oxide ($Al_2O_3$).

A touch buffer layer T-BUF may be disposed on the encapsulation layer 350.

The first and second touch electrodes X-TE and Y-TE and the first and second bridge patterns X-CL and Y-CL may be positioned on the touch buffer layer T-BUF.

All or part of each of the first and second touch lines X-TL and Y-TL may also be positioned on the touch buffer layer T-BUF.

The touch buffer layer T-BUF may be positioned between the touch electrodes X-TE and Y-TE and the cathode electrode CE. By the touch buffer film T-BUF, the separation distance between the touch electrodes X-TE and Y-TE and the cathode electrode CE of the light emitting element ED may be equal to or greater than a predetermined minimum separation distance (e.g., 5 μm) or be a predetermined optimum separation distance. Accordingly, parasitic capacitance between the touch electrodes X-TE and Y-TE and the cathode electrode CE may be reduced or prevented. Therefore, a decrease in touch sensitivity due to parasitic capacitance may be prevented.

The touch buffer layer T-BUF may not be present on the encapsulation layer 350. That is, the touch buffer layer T-BUF may not be disposed between the encapsulation layer 350 and the touch sensor metal layer. Here, the touch sensor metal layer may include first touch electrodes X-TE, second touch electrodes Y-TE, a first bridge pattern X-CL, a second bridge pattern Y-CL, and the like.

In the manufacturing process of the touch sensor metal, chemicals (developer or etchant, etc.) used in the process or moisture from the outside may occur. By arranging the touch buffer film T-BUF and disposing a touch sensor metal thereon, it may be possible to prevent the chemical liquid or moisture from penetrating into the light emitting layer EL containing the organic material during the manufacturing process of the touch sensor metal. Accordingly, the touch buffer layer T-BUF may prevent damage to the light emitting layer EL, which may be susceptible to chemicals or moisture.

The touch buffer film T-BUF may be formed of an organic insulating material having a low dielectric constant (e.g., 1~3 dielectric constant) and formed at a low temperature below a certain temperature (e.g., 100 degrees (° C.)) to prevent damage to the light emitting layer EL containing an organic material vulnerable to high temperatures. For example, the touch buffer film T-BUF may be formed of an acrylic-based, epoxy-based, or siloxane-based material. As the organic light emitting display device is bent, each encapsulation layer (PAS1, PCL, PAS2) in the encapsulation layer 350 may be damaged, and the touch sensor metal positioned on the touch buffer film T-BUF may be broken. Even if the organic light emitting display device is bent, the touch buffer film T-BUF having a flattening performance with an organic insulating material may prevent damage to the encapsulation layer 350 and/or cracks in the touch sensor metal.

According to the mutual-capacitance-based touch sensor structure, the first touch electrode line X-TEL and the second touch electrode line Y-TEL may be disposed on the touch buffer layer T-BUF, and the first touch electrode The line X-TEL and the second touch electrode line Y-TEL may be arranged to cross.

The second touch electrode line Y-TEL may include a plurality of second touch electrodes Y-TE. The second touch electrode line Y-TEL may further include a plurality of second bridge patterns Y-CL that electrically connect the plurality of second touch electrodes Y-TE. As illustrated in FIG. 8, the plurality of second touch electrodes Y-TE and the plurality of second bridge patterns Y-CL may be positioned on different layers with the touch insulating layer ILD therebetween.

Referring to FIGS. 8 and 9 together, the plurality of second touch electrodes Y-TE disposed in the same column may be spaced apart at regular intervals along the y-axis direction (column direction). Each of the plurality of second touch electrodes Y-TE may be electrically connected to another second touch electrode Y-TE adjacent in the y-axis direction through the second bridge pattern Y-CL.

The second bridge pattern Y-CL may be formed on the touch buffer layer T-BUF. The second bridge pattern Y-CL may be exposed through a touch contact hole passing through the touch insulating layer ILD and electrically connected to two second touch electrodes Y-TE adjacent in the y-axis direction.

The second bridge pattern Y-CL may be disposed to overlap the bank BANK. Accordingly, it may be possible to prevent the aperture ratio from being lowered by the second bridge pattern Y-CL.

Referring to FIGS. 8 and 9 together, the first touch electrode line X-TEL may include a plurality of first touch electrodes X-TE. The first touch electrode line X-TEL may further include a plurality of first bridge patterns X-CL that electrically connect the plurality of first touch electrodes X-TE. The plurality of first touch electrodes X-TE and the plurality of first bridge patterns X-CL may be positioned on different layers with the touch insulating layer ILD therebetween. Alternatively, the plurality of first bridge patterns X-CL and the plurality of first touch electrodes X-TE may be integrally formed and may be located on the same layer.

Referring to FIGS. 8 and 9 together, the plurality of first touch electrodes X-TE disposed in the same row may be spaced apart at regular intervals along the x-axis direction (row direction) on the touch insulating layer ILD. Each of the plurality of first touch electrodes X-TE may be electrically connected to another first touch electrode X-TE adjacent in the x-axis direction through the first bridge pattern X-CL.

The first bridge pattern X-CL may be disposed on the same plane as the first touch electrode X-TE and may be electrically connected to two first touch electrodes X-TE adjacent in the x-axis direction without a separate contact hole. Alternatively, the first bridge pattern X-CL may be integral with two first touch electrodes X-TE adjacent in the x-axis direction.

The first bridge pattern X-CL may be disposed to overlap the bank BANK. Accordingly, it may be possible to prevent the aperture ratio from being lowered by the first bridge pattern X-CL.

Referring to FIG. 9, the second touch electrode line Y-TEL may be electrically connected to the second touch pad Y-TP included in touch pad unit 511 in the first non-display area NA1 through the second touch line Y-TL. The second touch pad Y-TP may be electrically connected to the touch driving circuit 510.

Similar to this structure, the first touch electrode line X-TEL may be electrically connected to the first touch pad X-TP included in touch pad unit 511 in the first non-display area NA1 through the first touch line X-TL. The first touch pad X-TP may be electrically connected to the touch driving circuit 510.

The touch pad unit 511 may further include a pad cover electrode covering the first touch pad X-TP and the second touch pad Y-TP.

The first touch pad X-TP may be formed separately from the first touch line X-TL or may be formed by extending the first touch line X-TL. The second touch pad Y-TP may be formed separately from the second touch line Y-TL or may be formed by extending the second touch line Y-TL.

When the first touch pad X-TP is formed by extending the first touch line X-TL, and the second touch pad Y-TP is formed by extending the second touch line Y-TL, the first touch pad X-TP, the first touch line X-TL, the second touch pad Y-TP, and the second touch line Y-TL may include the same one or more first conductive materials and may be formed in a single layer or multilayer structure. For example, the first conductive material may include Al, Ti, Cu, Mo, and the like, and may be a metal having strong corrosion resistance, strong acid resistance, and good conductivity.

For example, each of the first touch pad X-TP, the first touch line X-TL, the second touch pad Y-TP, and the second touch line Y-TL may include the first conductive materials, and may be formed of a three-layer stacked structure, such as Ti/Al/Ti or Mo/Al/Mo.

The pad cover electrode capable of covering the first touch pad X-TP and the second touch pad Y-TP may include one or more second conductive materials. The second conductive material may include a transparent conductive material (e.g., ITO, IZO, etc.) having strong corrosion resistance and strong acid resistance. The pad cover electrode may be formed to be exposed by the touch buffer layer T-BUF to be bonded to the touch driving circuit 510 or to a circuit film on which the touch driving circuit 510 may be mounted. The second conductive material may also be included in the first and second touch electrodes X-TE and Y-TE.

The touch buffer layer T-BUF may be formed to cover the touch sensor metal, thereby preventing the touch sensor metal from being corroded by moisture or the like. For example, the touch buffer film T-BUF may be formed of an organic insulating material, or may be formed of a circular polarizing plate or a film of epoxy or acrylic material. The touch buffer layer T-BUF may not be on the encapsulation layer 350. That is, the touch buffer film T-BUF may not be an essential configuration.

The second touch line Y-TL may be electrically connected to the second touch electrode Y-TE through a contact hole, or may be integrally formed with the second touch electrode Y-TE.

The second touch line Y-TL electrically connects the second touch electrode Y-TE of the display area AA and the second touch pad Y-TP of the first non-display area NA1. A line portion of the second touch line Y-TL extended to the first non-display area NA1 may include a first line portion disposed along the inclined surface 900 of the encapsulation layer 350, a second line portion disposed on the one or more dams DAM1 and DAM2, and a third line portion electrically connected to the second touch pad Y-TP in the touch pad portion 511. The third line portion may be electrically connected to the touch driving circuit 510 through the second touch pad Y-TP. The first line portion may be closest to the display area AA, and the third line portion may be farthest from the display area AA.

The second touch line Y-TL may transfer a touch sensing signal from the second touch electrode Y-TE to the touch driving circuit 510 or may transfer the touch driving signal received from the touch driving circuit 510 to the second touch electrode Y-TE.

The first touch line X-TL may be electrically connected to the first touch electrode X-TE through a contact hole, or may be integrally formed with the first touch electrode X-TE.

The first touch line X-TL electrically connects the first touch electrode X-TE in the display area AA and the first touch pad X-TP in the first non-display area NA1. A line portion of the first touch line X-TL extended to the first non-display area NA1 may include a first line portion disposed along the inclined surface 900 of the encapsulation layer 350, a second line portion disposed on the one or more dams DAM1 and DAM2, and a third line portion electrically connected to the first touch pad X-TP in the touch pad portion 511. The third line portion may be electrically connected to the touch driving circuit 510 through the first touch pad X-TP. The first line portion may be closest to the display area AA, and the third line portion may be farthest from the display area AA.

The first touch line X-TL may transfer the touch driving signal received from the touch driving circuit 510 to the first touch electrode X-TE or may transfer a touch sensing signal from the first touch electrode X-TE to the touch driving circuit 510.

The arrangement of the first touch line X-TL and the second touch line Y-TL may be variously changed according to the panel design.

A touch protection layer PAC may be disposed on the first touch electrode X-TE and the second touch electrode Y-TE. The touch protection layer PAC may be extended to before or after the one or more dams DAM 1 and DAM2, and may be disposed on the first touch line X-TL and the second touch line Y-TL.

Meanwhile, the cross-sectional view of FIG. 9 conceptually shows the structure, depending on the viewing direction or location, the position, thickness, or width of each pattern (various layers or various electrodes) may be changed, and the connection structure of various patterns may also be changed. In addition to the various layers shown, there may be additional layers, some of the various layers shown may be omitted or integrated. For example, the width of the bank BANK may be narrow compared to the width represented in FIG. 9, and the heights of the dams DAM1 and DAM2 may be lower or higher than the heights illustrated in FIG. 9.

Figure 10:
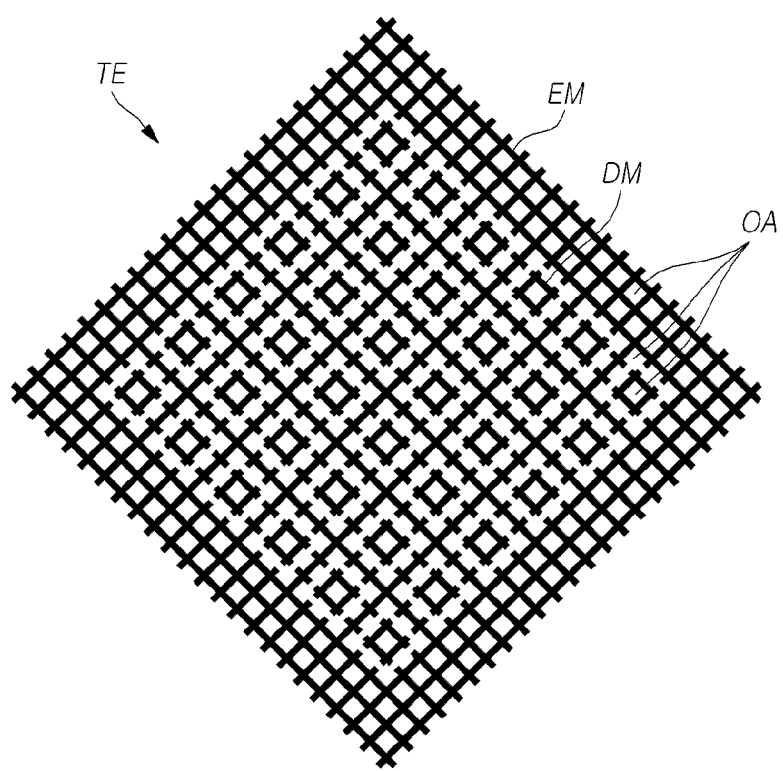
FIG. 10 is an exemplary view illustrating the touch electrode in the display panel of the display device according to aspects of the present disclosure.

FIG. 10 is an exemplary view illustrating the touch electrode TE in the display panel 100 of the display device 10 according to aspects of the present disclosure.

Referring to FIG. 10, each of the touch electrodes TE positioned in the first area A1 among the touch electrodes TE disposed inside the display panel 100 may be a mesh-type electrode having one or more openings or a mesh-type electrode. Each of the touch electrodes TE positioned in the first area A1 among the touch electrodes TE may be a transparent electrode or may include a transparent electrode.

As described above, since the touch electrode TE positioned in the first area A1 may be a mesh type or formed of a transparent electrode, the transmittance of the first area A1 may be increased. Accordingly, a shooting function of the camera 110 through the first area A1 and a sensing function of the proximity sensor 120 through the first area A1 may be enabled.

One touch electrode TE may be a transparent electrode without an opening (open area).

Alternatively, one touch electrode TE may be a mesh type having a plurality of open areas OA. That is, one touch electrode TE may be an electrode metal EM patterned in a mesh type to have a plurality of open areas OA. Here, the electrode metal EM may be one of the touch sensor metals.

Each of the plurality of open areas OA present on one touch electrode TE may correspond to the emission area of one or more subpixels SP. That is, the plurality of open areas OA serves as a path through which light emitted from the plurality of subpixels SP disposed under the touch electrode TE passes upward. The plurality of open areas OA present in each touch electrode TE disposed in the first area A1 may further improve transmittance in the first area A1.

In the touch electrode TE, the actual electrode part (that is, the electrode metal EM) excluding the plurality of open areas OA may be positioned on the bank BANK.

The method of forming the multiple touch electrodes TE is as follows. After the electrode metal EM is broadly formed in a mesh type in an area for forming a plurality of touch electrodes TE, the electrode metal EM is cut along a predetermined cutting line. Here, the predetermined cutting line corresponds to a boundary of a plurality of touch electrodes TE to be formed. After the cutting process, a plurality of separated electrode metals EM may be formed as a plurality of touch electrodes TE.

For example, the outer shape of the touch electrode TE may be a diamond shape, a rhombus shape, or a square shape, or may be various shapes such as a triangle, pentagon, or hexagon. The outer shape of the touch electrode TE is not limited to these examples and may be various shapes.

Referring to FIG. 10, in the area occupied by the mesh type touch electrode TE, one or more dummy metals DM may exist in a form separated from the mesh type electrode metal EM.

The electrode metal EM may be an electrode portion corresponding to the actual touch electrode TE, and may be an electrode where a touch driving signal may be applied or a touch sensing signal may be sensed. However, although the dummy metal DM may be present in the area of the touch electrode TE, the dummy metal DM may be a floating metal part in which the touch driving signal may not be applied and the touch sensing signal may not be detected. That is, the dummy metal DM may be an electrically floating and isolated metal.

Therefore, the electrode metal EM may be electrically connected to the touch driving circuit 510, but the dummy metal DM may not be electrically connected to the touch driving circuit 510.

In each area of all the touch electrodes TE, one or more dummy metals DM may exist in a state of being disconnected from the electrode metals EM. Alternatively, the one or more dummy metals DM may exist only in an area of some touch electrodes TE of all touch electrodes TE, and may not exist in areas of other touch electrodes TE.

Meanwhile, in relation to the role of dummy metal DM, when one or more dummy metals DM do not exist in the area of the touch electrode TE and only the electrode metal EM exists in a mesh type, visibility issues in which the outline of the electrode metal EM may be displayed on the screen may occur.

In comparison, when one or more dummy metals DM are present in the area of the touch electrode TE, visibility issues in which the outline of the electrode metal EM may be displayed on the screen may be prevented.

In addition, for each touch electrode TE, by controlling the existence or number of dummy metal DMs (dummy metal ratio), the effective electrode area that affects the size of the mutual-capacitance for each touch electrode TE may be adjusted. Through this, the size of the mutual-capacitance between the first touch electrode X-TE and the second touch electrode Y-TE may be adjusted to improve touch sensitivity.

On the other hand, by cutting some points from the electrode metal EM formed in the area of one touch electrode TE, the electrode metal parts falling off the original electrode metal EM may form the dummy metal DM. Therefore, the electrode metals EM and the dummy metal DM may be the same material formed on the same layer.

Figure 11:
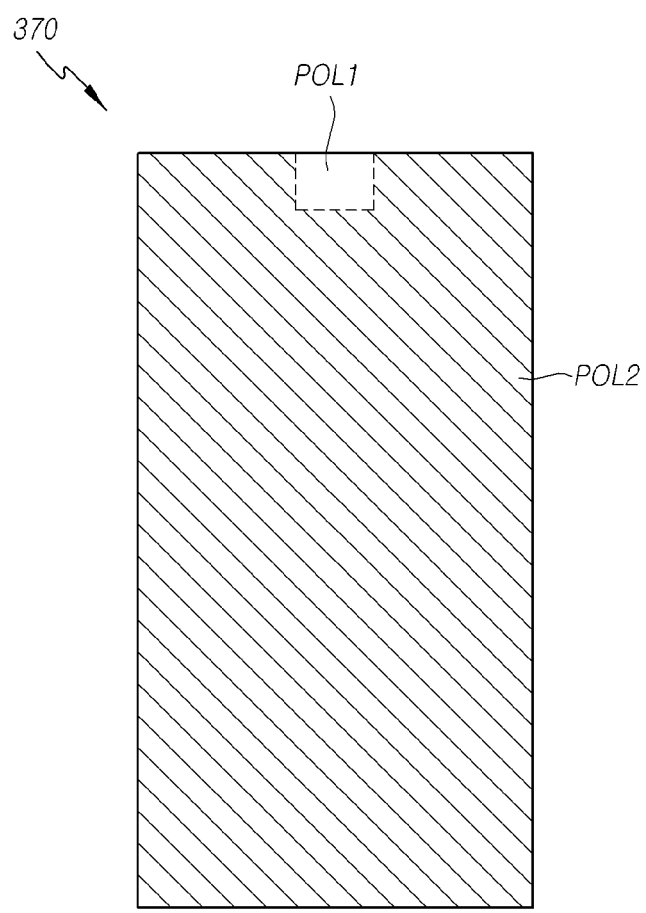
FIG. 11 is a view showing the polarizing plate in the display panel of the display device according to aspects of the present disclosure.

FIG. 11 is a view showing the polarizing plate 370 in the display panel 100 of the display device 10 according to aspects of the present disclosure.

Referring to FIG. 11, the polarizing plate 370 in the display panel 100 of the display device 10 according to aspects of the present disclosure may include a first portion POL1 corresponding to the first area A1 and a second portion POL2 corresponding to the second area A2.

In the polarizing plate 370, the first portion POL1 may have a higher transmittance than the second portion POL2. The first portion POL1 may have a transmittance equal to or greater than a predetermined threshold transmittance. The second portion POL2 may have a transmittance less than a predetermined threshold transmittance. Here, the predetermined threshold transmittance may be a minimum transmittance that allows the functions of each of the camera 110 and the proximity sensor 120 to be normally performed.

As described above, since the first portion POL1 of the polarizing plate 370 may be formed with a high transmittance, the transmittance of the first area A1 corresponding to the first portion POL1 of the polarizing plate 370 may be increased. Accordingly, the shooting function of the camera 110 through the first area A1 and the sensing function of the proximity sensor 120 through the first area A1 may be normally performed.

Each of the optical transparent adhesive 380 and the cover glass 390 positioned on the polarizing plate 370 may have a transmittance equal to or greater than the predetermined threshold transmittance. Here, the predetermined threshold transmittance may be a minimum transmittance that allows the functions of each of the camera 110 and the proximity sensor 120 to be normally performed.

Figure 12:
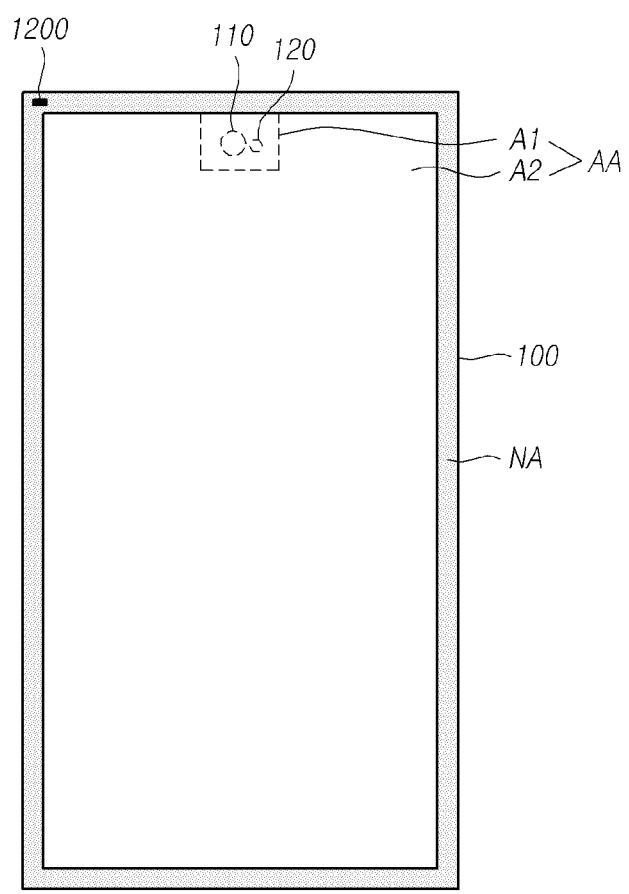
FIGS. 12 and 13 are views for explaining the position of the light generating device for the proximity sensor in the display panel of the display device according to aspects of the present disclosure.
Figure 13:
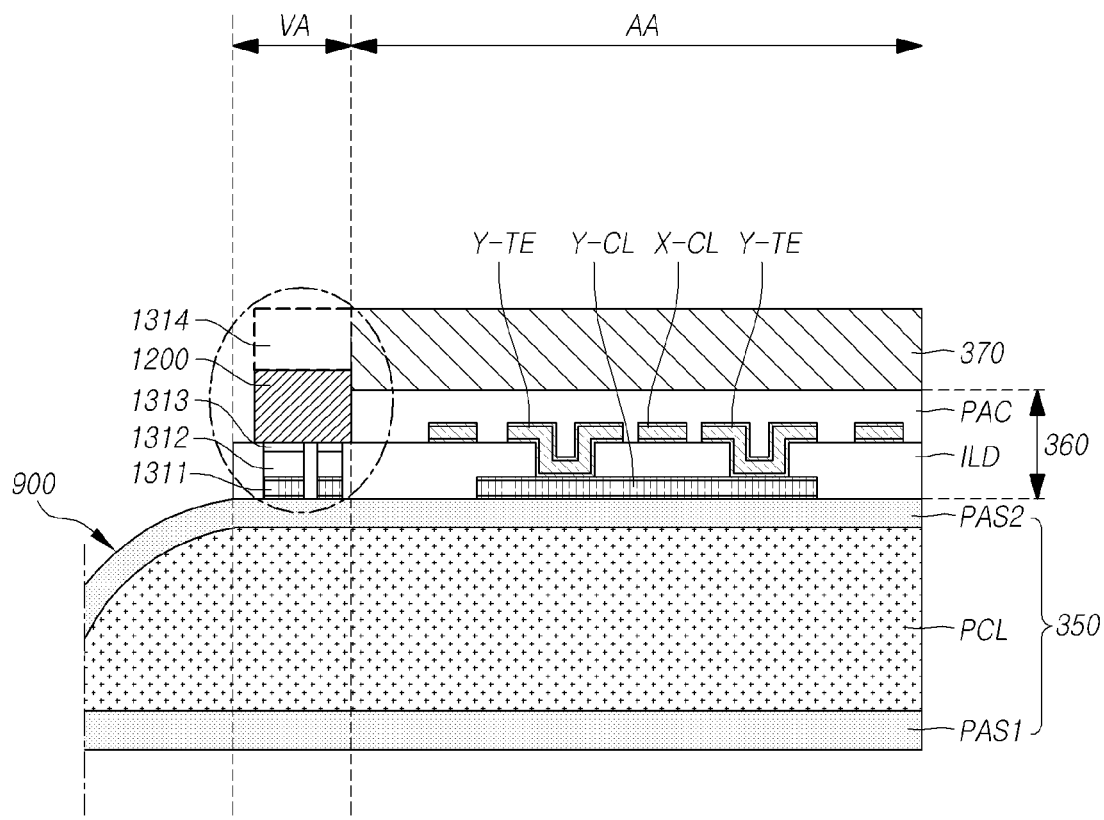

FIGS. 12 and 13 are views for explaining the position of the light generating device 1200 for the proximity sensor 120 in the display panel 100 of the display device 10 according to aspects of the present disclosure.

FIGS. 12 and 13, the display device 10 according to aspects of the present disclosure may include a proximity sensor 120 that detects whether a nearby human body or object is in proximity. The proximity sensor 120 may detect whether a human body or an object is in close proximity by receiving light (e.g., infrared rays) flowing into the light incident part IA.

The display device 10 according to aspects of the present disclosure may further include a light generating device 1200 that generates light (e.g., infrared light). The proximity sensor 120 may detect a nearby human body or object using light emitted from the light generating device 1200.

When the light generating device 1200 generates light, light generated by the light generating device 1200 and emitted to the outside is reflected by a human body or an object proximate to the display device 10. The reflected light flows into the light incident part IA corresponding to the first area A1 of the display device 10.

Since the proximity sensor 120 is located under the display panel 100, but is located in the first area A1 in the display area AA, the proximity sensor 120 may receive light flowing into the light incident part IA corresponding to the first area A1. The proximity sensor 120 may detect whether a human body or an object is in proximity based on the light received through the light incident part IA. The proximity sensor 120 may be viewed as including a light generating device 1200.

FIGS. 12 and 13, the light generating device 1200 may be located on the encapsulation layer 350 and may be located on the side of the touch sensor layer 360. For example, the light generating device 1200 may be located on any one of the upper left side, upper right side, lower left side, or lower right side of the touch sensor layer 360. The light generating device 1200 may be located at one corner of the display panel 100.

Referring to FIG. 13, the area between the point where the display area AA ends and the point where the inclined surface 900 of the encapsulation layer 360 starts may be referred to as a viewing area VA. The light generating device 1200 may be positioned on the encapsulation layer 350, but may be located in the viewing area VA between the inclined surface 900 and the display area AA of the encapsulation layer 350.

With respect to the seating structure of the light generating device 1200, one or more pads 1311 may be disposed at one or more points on the flattened surface of the encapsulation layer 350 in the viewing area VA. One or more bumpers 1313 may be bonded to one or more pads 1311 by the bonding agent 1312. The light generating device 1200 may be mounted on one or more bumpers 1313.

The uppermost point of the light generating device 1200 may be lower than the uppermost point of the polarizing plate 370 formed on the touch sensor layer 360. Therefore, an upper space 1314 may exist on the light generating device 1200. The touch sensor layer 360 includes touch sensor metals including the first touch electrode X-TE, the second touch electrode Y-TE, the first bridge pattern X-CL, and the second bridge pattern Y-CL. Some (e.g., second bridge pattern Y-CL) of the touch sensor metals are disposed on the first touch sensor metal layer, and the rest (e.g., first touch electrode X-TE, second touch electrode Y-TE, first bridge pattern X-CL) may be disposed on the second touch sensor metal layer positioned over the first touch sensor metal layer. The touch sensor layer 360 may further include an interlayer insulating layer ILD positioned between the first touch sensor metal layer and the second touch sensor metal layer, and include a touch protection layer PAC positioned on the second touch sensor metal layer.

Since the light generating device 1200 is lower than the polarizing plate 370 formed on the touch sensor layer 360, the upper space 1314 of the light generating device 1200 corresponds to a hole of the polarizing plate 370.

Figure 14:
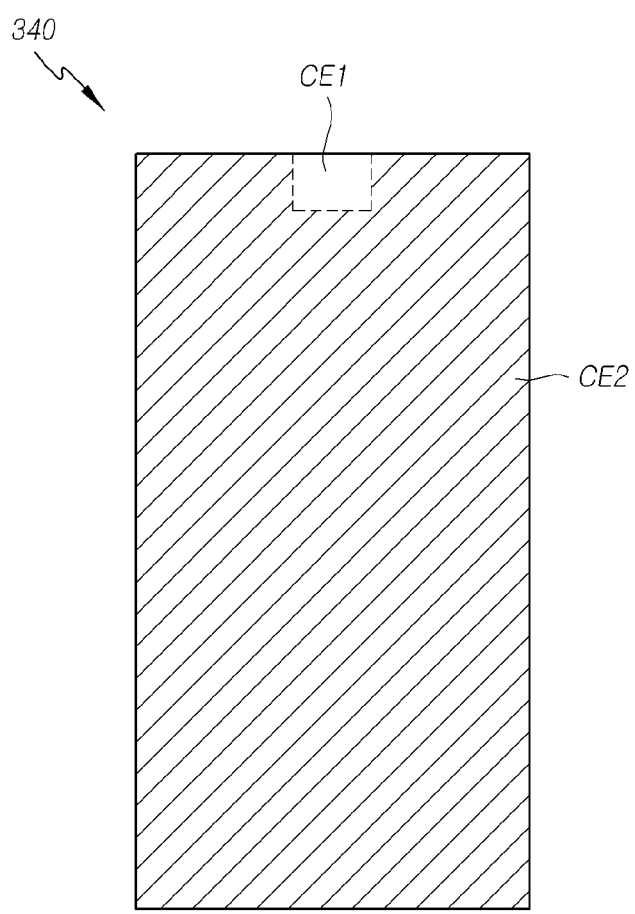
FIG. 14 is a view showing a heterogeneous cathode electrode layer of the display device according to aspects of the present disclosure.

FIG. 14 is a view showing a heterogeneous cathode electrode layer 340 of the display device 10 according to aspects of the present disclosure.

Referring to FIG. 14, the heterogeneous cathode electrode layer 340 includes a first cathode electrode CE1 and a second cathode electrode CE2.

The first cathode electrode CE1 may be disposed in the first area A1 and may have a first transmittance equal to or greater than a predetermined threshold transmittance. Here, the first area A1 may overlap the optical device (e.g., camera 110, proximity sensor 120, etc.) and may be a part of the display area AA. The predetermined threshold transmittance may be a minimum transmittance value that allows the functions of the camera 110 and the proximity sensor 120 to be normally performed.

The second cathode electrode CE2 may be disposed in the second area A2 different from the first area A1 in the display area AA, and may have a second transmittance different from the first transmittance of the first cathode electrode CE1. Here, the second transmittance may be lower than the first transmittance, and may be less than the predetermined threshold transmittance.

The first cathode electrode CE1 may be a transparent electrode having the first transmittance higher than the second transmittance. For example, the first cathode electrode CE1 may include one or more of IZO (Indium Zinc Oxide), ITO (Indium Tin Oxide), ZnO (Zinc Oxide), Ba/Ag, Ca/Ag, graphene, silver nanowire, and carbon nanotubes, and the like.

The second cathode electrode CE2 may be a semi-transparent electrode having the second transmittance lower than the first transmittance. For example, the second cathode electrode CE2 may include one or more of Mg, Ag, or the like.

Figure 15:
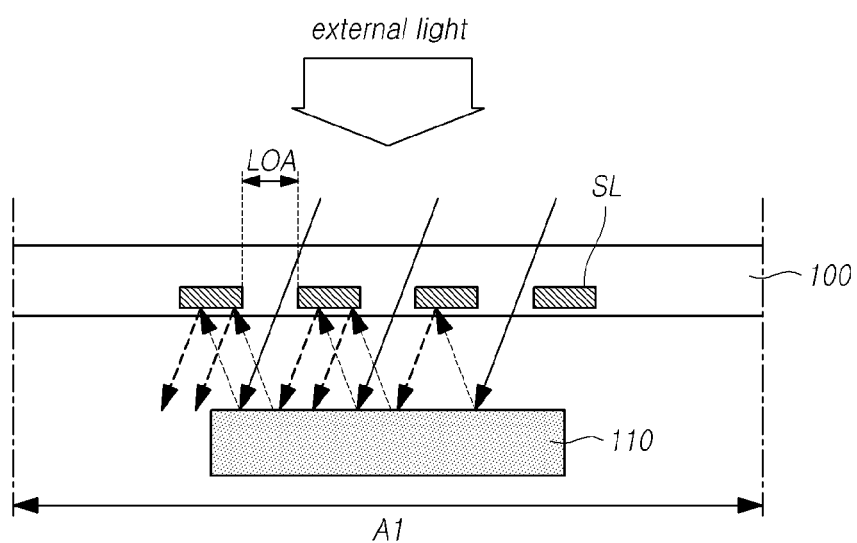
FIG. 15 is a diagram illustrating a wiring structure in the first area in which the camera is disposed in the display area of the display device according to aspects of the present disclosure.

FIG. 15 is a diagram illustrating a wiring structure in the first area A1 in which the camera 110 is disposed in the display area AA of the display device 10 according to aspects of the present disclosure.

Referring to FIG. 15, external light must be incident for a front photographing function of the camera 110 disposed overlapping with the first area A1 in the display area AA of the display panel 100.

The first area A1 in which the camera 110 is disposed is included in the display area AA in which the image is displayed. Therefore, the wirings SL for the display may be disposed in the first area A1. The wirings SL in this specification may be signal lines or electrodes, or may be various structures formed of a metal pattern. That the camera 110 is disposed in the first area A1 may have the same meaning that the camera 110 overlaps the first area A1.

Since the first area A1 in which the camera 110 is disposed is included in the display area AA in which the image is displayed, external light is incident through the side opening LOA between the metal wires SL to reach the front of the camera 110.

The external light reaching the front surface of the camera 110 may be reflected from the front surface of the camera 110. The external light reflected from the front surface of the camera 110 may be reflected back from the rear surface of the wiring SL, the external light reflected from the rear surface of the wiring SL is reflected from the front surface of the camera 110 again, and the external light reflected back from the front surface of the camera 110 may be reflected back from the rear surface of the wiring SL. This reflection process may be repeated continuously.

The repetitive reflection process between the camera 110 and the wiring SL causes light scattering and interference, and makes it impossible to take a normal image through the camera 110 or obtain a high-resolution image.

Figure 16:
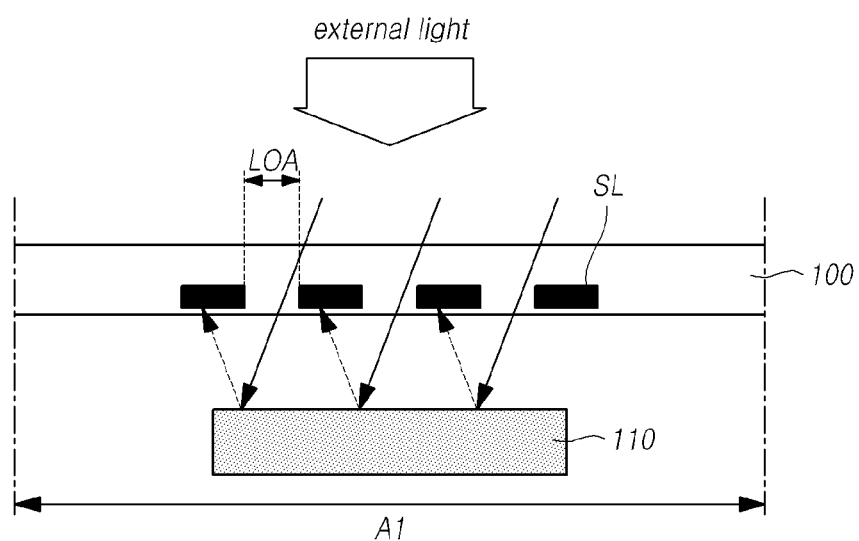
FIG. 16 is a view showing a low reflection structure in the first area in which the camera is disposed in the display area of the display device according to aspects of the present disclosure.

FIG. 16 is a view showing a low reflection structure in the first area A1 in which the camera 110 is disposed in the display area AA of the display device 10 according to aspects of the present disclosure.

Referring to FIG. 16, the display device 10 according to aspects of the present disclosure may provide a low reflection structure to prevent a repetitive reflection process between the camera 110 and the wiring SL.

Referring to FIG. 16, external light incident through the side opening LOA between the wirings SL having a low reflection structure may be reflected from the front surface of the camera 110. The external light reflected from the front surface of the camera 110 may not be reflected from the rear surface of the wiring SL having a low reflection structure or the reflectance may be significantly reduced. Therefore, a repetitive reflection process between the camera 110 and the wiring SL may be prevented.

Therefore, using the low reflection structure according to aspects of the present disclosure, even if the camera 110 is disposed under the display area AA of the display panel 100 and is not exposed to the front surface, a high-resolution image may be acquired through the camera 110.

Below, the low reflection structure will be described in more detail. However, the low reflective structure will be described below from the viewpoint of wiring, but may be applied to various types of metal patterns such as electrodes.

Figure 17:
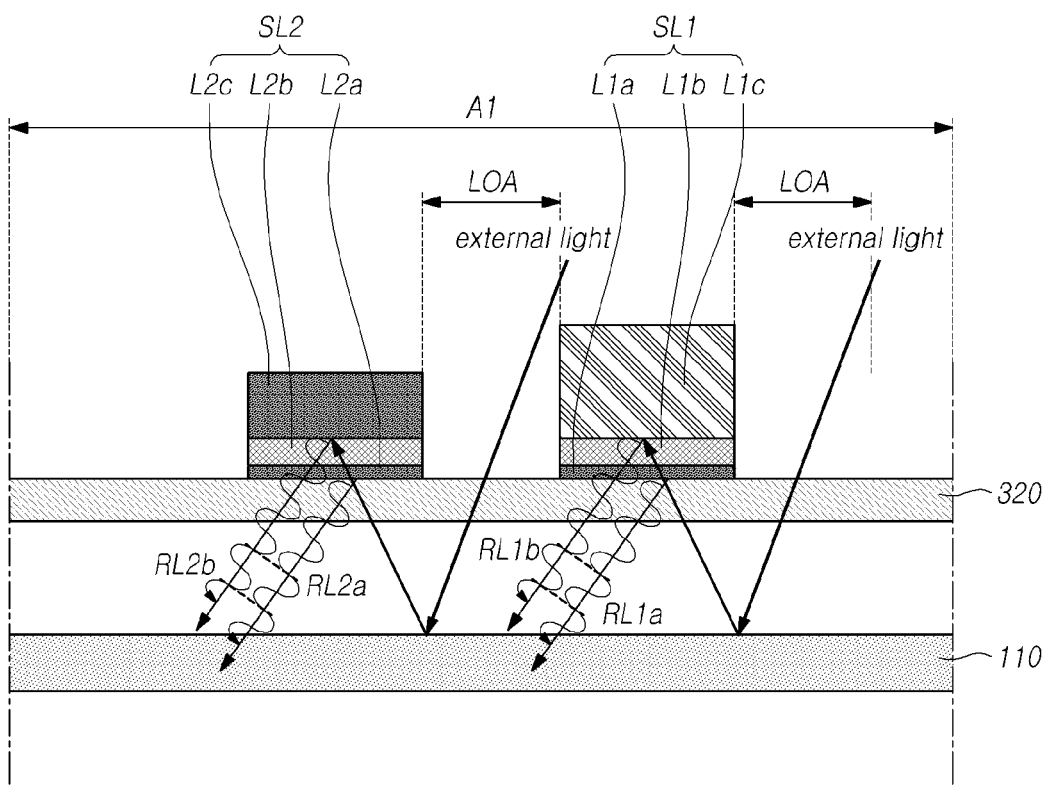
FIG. 17 is a view illustrating in detail the low reflection structure in the first area in which the camera is disposed in the display area of the display device according to aspects of the present disclosure.
Figure 18A:
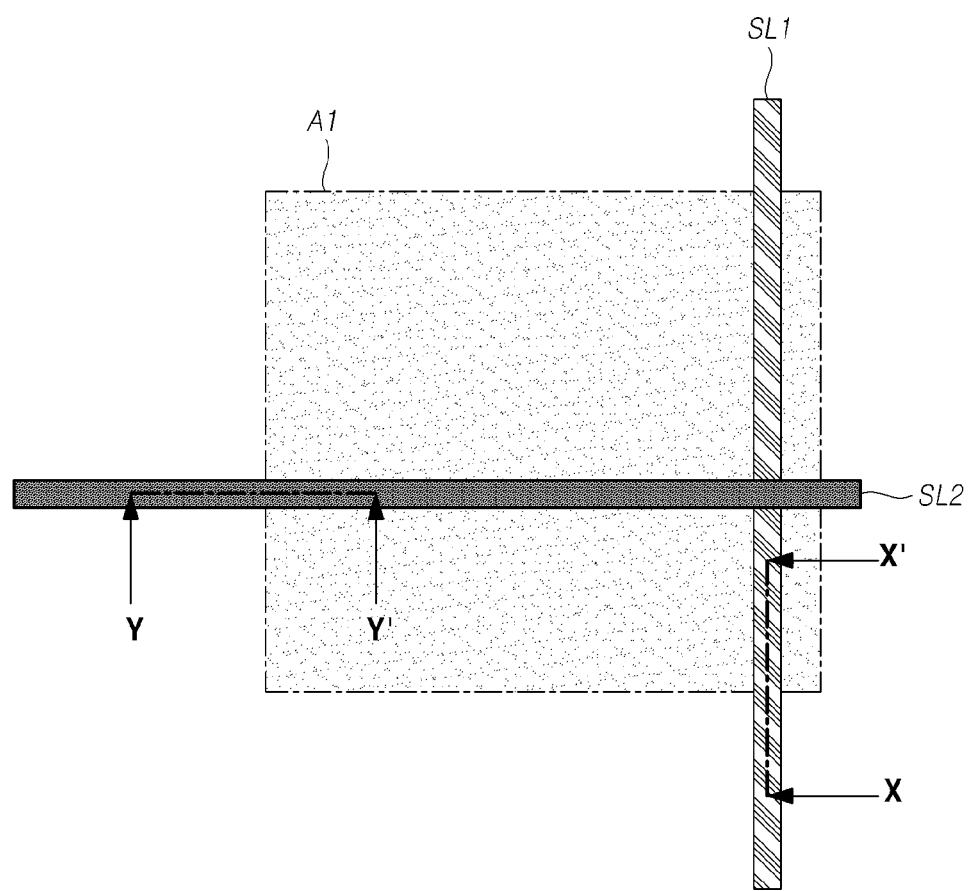
FIGS. 18A, 18B and 18C are diagrams illustrating the low reflection structure in the first area where the camera is disposed and the wiring structure in the second area where the camera is not disposed in a display area of the display device according to aspects of the present disclosure.
Figure 18B:
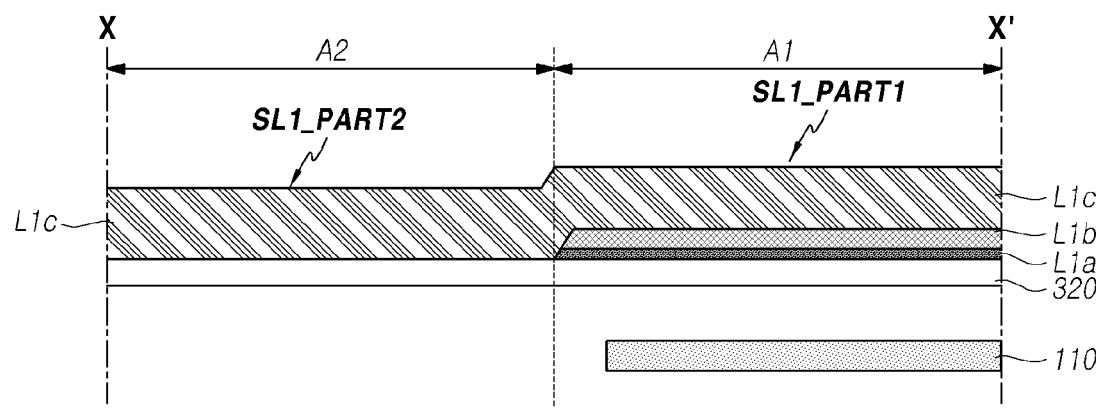
Figure 18C:
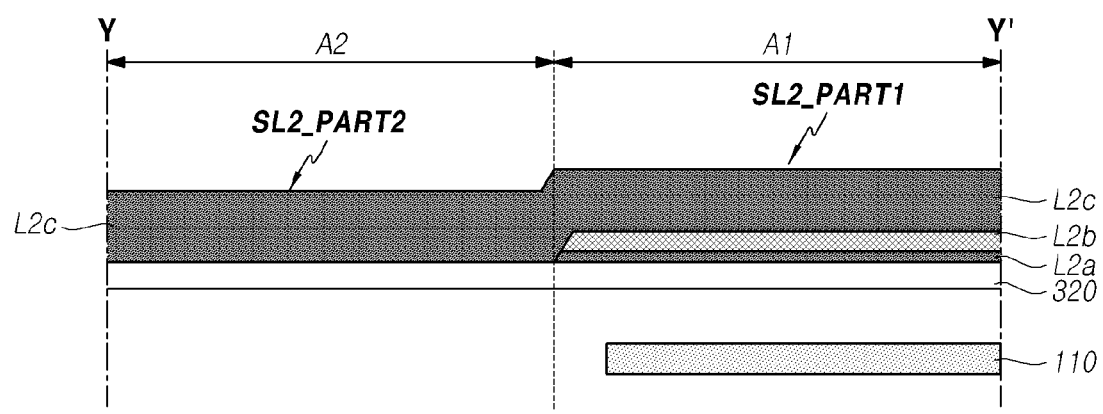

FIG. 17 is a view illustrating in detail the low reflection structure in the first area A1 in which the camera 110 is disposed in the display area AA of the display device 10 according to aspects of the present disclosure. FIGS. 18A to 18C are diagrams illustrating the low reflection structure in the first area A1 where the camera 110 is disposed and the wiring structure in the second area A2 where the camera 110 is not disposed in a display area AA of the display device 10 according to aspects of the present disclosure. FIG. 18B is a cross-sectional view taken along line X-X' in FIG. 18A. FIG. 18C is a sectional view taken along line Y-Y' in FIG. 18A.

Referring to FIGS. 17 and 18A to 18C, the display device 10 according to aspects of the present disclosure may include a display panel 100 including a display area AA in which an image is displayed, a camera 110 for photographing the front of the display panel 100, and etc. The camera 110 may be disposed under the display area AA of the display panel 100. Accordingly, the camera 110 is not exposed to the outside. The camera 110 referred to in this specification may be a camera lens.

The display panel 100 may include a substrate 320 and a first wiring SL1 positioned on the substrate 320 and disposed on the display area AA.

The camera 110 may be disposed under the display area AA of the display panel 100 so as not to be exposed to the outside, and may be positioned to overlap the first area A1 in the display area AA.

Referring to FIGS. 17, 18A and 18B, all or part of the first wiring SL1 may overlap the first area A1. Therefore, all or part of the first wiring SL1 may overlap the camera 110 overlapping the first area A1.

The display area AA on which the image is displayed on the display panel 100 may include a first area A1 in which an optical device such as a camera 110 is disposed, and a second area A2 different from the first area A1.

Referring to FIGS. 17, 18A, and 18B, the first wiring SL1 may include a first portion SL1_PART1 overlapping with the first area A1 and a second portion SL1_PART2 overlapping with the second area A2 different from the first area A1.

Referring to FIGS. 17, 18A and 18B, the first portion SL1_PART1 overlapping the first area A1 in the first wiring SL1 may include: a first semi-transmissive layer L1$a$ positioned over the substrate 320; a first optical path compensation layer L1$b$ positioned on the first semi-transmissive layer L1$a$; and a first metal layer L1$c$ located on the first optical path compensation layer L1$b$ and including a first metal.

The first semi-transmissive layer L1$a$ may have a thickness thinner than the thickness of the first optical path compensation layer L1$b$. For example, the first semi-transmissive layer L1$a$ may have a thickness of 1 nm to 5 nm. The first optical path compensation layer L1$b$ may have a thickness of 30 nm to 120 nm.

The relationship between the thicknesses of the three layers L1a, L1b, and L1c constituting the first wiring SL1 may be as follows. For example, among the first semi-transmissive layer L1a, the first optical path compensation layer L1b, and the first metal layer L1c, the thickness of the first semi-transmissive layer L1a closest to the camera 110 may be the thinnest. Among the first semi-transmissive layer L1a, the first light path compensation layer L1b, and the first metal layer L1c, the thickness of the first metal layer L1c closest to the portion where external light is incident may be the thickest.

The first optical path compensation layer L1b may include a conductive transparent material.

For example, the first optical path compensation layer L1b may include one or more conductive transparent materials such as Indium Tin Oxide (ITO), Indium Zinc Oxide (IZO), Zinc Oxide (ZnO), Indium Zinc Tin Oxide (IZTO), SiO2, SiNx, etc.

Referring to FIG. 17, external light may be incident in the side opening LOA of the first wiring SL1 and may be reflected from the front surface (upper surface) of the camera 110 positioned under the first wiring SL1.

Referring to FIG. 17, a portion RL1a of the external light reflected from the front surface of the camera 110 may be reflected from the rear surface of the first semi-transmissive layer L1a. The other portion RL1b of the external light reflected from the front surface of the camera 110 may pass through the first semi-transmissive layer L1a and the first optical path compensation layer L1b, and may be reflected from the rear surface of the first metal layer L1c.

Referring to FIG. 17, the external light RL1a reflected from the rear surface of the first semi-transmissive layer L1a and the external light RL1b reflected from the rear surface of the first metal layer L1c may have a phase difference by an odd multiple of 180 degrees.

Referring to FIG. 17, the difference in the optical path length between the external light RL1a reflected from the rear surface of the first semi-transmissive layer L1a and the external light RL1b reflected from the rear surface of the first metal layer L1c may be an odd multiple of half wavelength.

Accordingly, when the external light RL1a reflected from the rear surface of the first semi-transmissive layer L1a and the external light RL1b reflected from the rear surface of the first metal layer L1c meet, a destructive interference may occur.

Therefore, a repetitive reflection process between the first wiring SL1 and the camera 110 may be prevented. Accordingly, scattering of light between the first wiring SL1 and the camera 110 may also be prevented.

Meanwhile, 'when the vertical position relationship between the first semi-transmissive layer L1a and the first optical path compensation layer L1b is changed or the thickness relationship of the first semi-transmissive layer L1a and the first optical path compensation layer L1b is changed, a low reflective structure may not be formed, and light scattering between the first wiring SL1 and the camera 110 may not be prevented.

Referring to FIGS. 17, 18A, and 18B, the second portion SL1_PART2 overlapping the second area A2 in the first wiring SL1 may include the first metal layer L1c including the first metal, but may not include the first semi-transmissive layer L1a and the first optical path compensation layer L1b. That is, the second portion SL1_PART2 overlapping the second area A2 in the first wiring SL1 may be a single layer. The second area A2 may be located in the display area AA and may be an area different from the first area A1 overlapping with the camera 110.

Referring to FIG. 17, the display panel 100 of the display device 10 may further include a second wiring SL2 located over the substrate 320 and disposed in the display area AA. All or part of the second wiring SL2 may overlap the first area A1 in the display area AA.

Referring to FIGS. 17, 18A, and 18c, the second wiring SL2 may include a first portion SL2_PART1 overlapping the first area A1 and a second portion SL2_PART2 overlapping the second area A2.

Referring to FIGS. 17, 18A, and 18C, the first portion SL2_PART1 overlapping with the first region A1 in the second wiring SL2 may include: a second semi-transmissive layer L2a positioned over the substrate 320; a second optical path compensation layer L2b positioned on the second semi-transmissive layer L2a; and a second metal layer L2c positioned on the second optical path compensation layer L2b and including a second metal different from the first metal.

The first semi-transmissive layer L1a of the first wiring SL1 and the second semi-transmissive layer L2a of the second wiring SL2 may include the same material. The first semi-transmissive layer L1a of the first wiring SL1 and the second semi-transmissive layer L2a of the second wiring SL2 may have a corresponding thickness.

The first optical path compensation layer L1b of the first wiring SL1 and the second optical path compensation layer L2b of the second wiring SL2 may include the same material. The first optical path compensation layer L1b of the first wiring SL1 and the second optical path compensation layer L2b of the second wiring SL2 may have a corresponding thickness.

Referring to FIGS. 17, 18A, and 18C, the second portion SL2_PART2 overlapping the second region A2 in the second wiring SL2 may include the second metal layer L2c including the second metal, but may not include the second semi-transmissive layer L2a and the second optical path compensation layer L2b. That is, the second portion SL2_PART2 overlapping with the second area A2 in the second wiring SL2 may be a single layer. The second area A2 may be located in the display area AA and may be an area different from the first area A1 overlapping with the camera 110.

For example, the first metal included in the first metal layer L1c of the first wiring SL1 may include a source-drain metal, and the second metal included in the second metal layer L2c of the second wiring SL2 may include a gate metal. Conversely, the first metal included in the first metal layer L1c of the first wiring SL1 may include a gate metal, and the second metal included in the second metal layer L2c of the second wiring SL2 may include a source-drain metal.

For example, the source-drain metal may be a metal included in a source electrode and a drain electrode of a transistor (e.g., DRT, SCT, etc.) or a metal included in a wiring such as a data line DL. The gate metal may be a metal included in a gate electrode of a transistor (e.g., DRT, SCT, etc.) or a metal included in a wiring such as a gate line GL.

Referring to FIG. 17, external light enters the opening LOA between the first wiring SL1 and the second wiring SL2 from the upper portion of the substrate 320, and is directed toward the front surface of the camera 110. All or a portion of the external light may be reflected from the front surface of the camera 110.

In the region where the first wiring SL1 including the three layers L1a, L1b, and L1c is formed, the portion RL1a of the external light reflected from the front surface of the camera 110 may be reflected again from the rear surface of the first semi-transmissive layer L1a. The other part RL1b of the external light reflected from the front surface of the camera 110 may pass through the first semi-transmissive layer L1a and the first optical path compensation layer L1b, and may be reflected again from the rear surface of the first metal layer L1c.

In the region where the first wiring SL1 is formed, the external light RL1a reflected from the rear surface of the first semi-transmissive layer L1a and the external light RL1b reflected from the rear surface of the first metal layer L1c may have a phase difference by an odd multiple of 180 degrees.

In the region where the first wiring SL1 is formed, the optical path length difference between the external light RL1a reflected from the rear surface of the first semi-transmissive layer L1a and the external light RL1b reflected from the rear surface of the first metal layer L1c may be an odd multiple of half wavelength.

In the region where the first wiring SL1 is formed, when the external light RL1a reflected from the rear surface of the first semi-transmissive layer L1a and the external light RL1b reflected from the rear surface of the first metal layer L1c meet, a destructive interference may occur.

Therefore, in the region where the first wiring SL1 is formed, a repetitive reflection process between the first wiring SL1 and the camera 110 may be prevented. Accordingly, scattering of light between the first wiring SL1 and the camera 110 may also be prevented.

Further, in the region where the second wiring SL2 including the three layers L2a, L2b, and L2c is formed, the portion RL2a of the external light reflected from the front surface of the camera 110 may be reflected again from the rear surface of the second semi-transmissive layer L2a. The other part RL2b of the external light reflected from the front surface of the camera 110 may pass through the second semi-transmissive layer L2a and the second optical path compensation layer L2b, and may be reflected again from the rear surface of the second metal layer L2c.

In the region where the second wiring SL2 is formed, the external light RL2a reflected from the rear surface of the second semi-transmissive layer L2a and the external light RL2b reflected from the rear surface of the second metal layer L2c may have a phase difference by an odd multiple of 180 degrees.

In the region where the second wiring SL2 is formed, the difference in the optical path length between the external light RL2a reflected from the rear surface of the second semi-transmissive layer L2a and the external light RL2b reflected from the rear surface of the second metal layer L2c may be an odd multiple of half wavelength.

In the region where the second wiring SL2 is formed, when the external light RL2a reflected from the rear surface of the second semi-transmissive layer L2a and the external light RL2b reflected from the rear surface of the second metal layer L2c meet, a destructive interference may occur.

Therefore, in the region where the second wiring SL2 is formed, the repetitive reflection process between the second wiring SL2 and the camera 110 may be prevented, and accordingly, scattering of light between the second wiring SL2 and the camera 110 may also be prevented.

Figure 19:
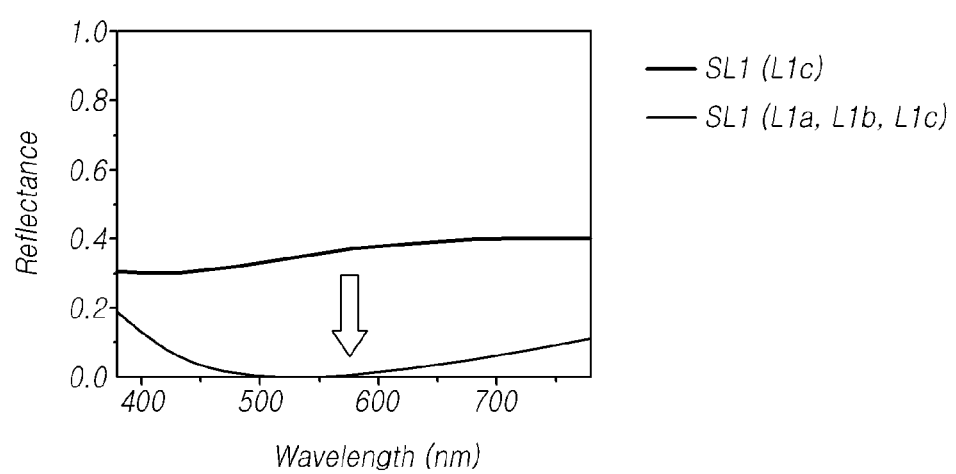
FIGS. 19 and 20 are graphs showing a low reflection effect when the low reflection structure is applied in the first area in which the camera is disposed in the display area of the display device according to aspects of the present disclosure.
Figure 20:
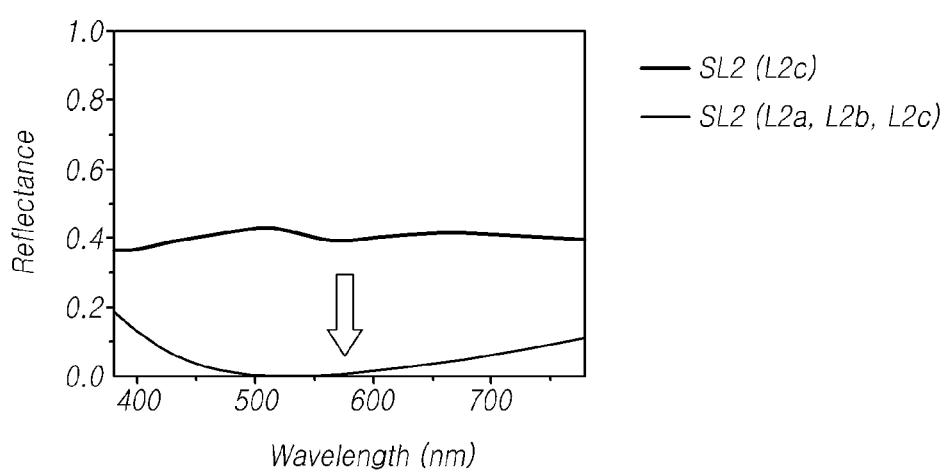

FIGS. 19 and 20 are graphs showing a low reflection effect when the low reflection structure is applied in the first area A1 in which the camera 110 is disposed in the display area AA of the display device 10 according to aspects of the present disclosure.

FIG. 19 is a graph showing the results of measuring reflectance of each of the first wiring SL1 to which the low reflection structure is applied and the first wiring SL1 to which the low reflection structure is not applied.

The first wiring SL1 to which the low reflection structure is applied may have a multi-layer structure. The first wiring SL1 to which the low reflection structure is applied may include the first semi-transmissive layer L1a formed of the thin film, the first optical path compensation layer L1b configured to make an optical path length difference, and the first metal layer L1c configured to serve as the main wiring. The first wiring SL1 to which the low reflection structure is not applied may have a single layer structure. That is, the first wiring SL1 without the low reflection structure may include only the first metal layer L1c serving as the main wiring.

FIG. 20 is a graph showing the results of measuring reflectance of each of the second wiring SL2 to which the low reflection structure is applied and the second wiring SL2 to which the low reflection structure is not applied.

The second wiring SL2 to which the low reflection structure is applied may have a multi-layer structure. The second wiring SL2 to which the low reflection structure is applied may include the second semi-transmissive layer L2a formed of the thin film, the second optical path compensation layer L2b configured to make an optical path length difference, and the second metal layer L2c configured to serve as the main wiring. The second wiring SL2 to which the low reflection structure is not applied may have a single layer structure. That is, the second wiring SL2 without the low reflection structure may include only the second metal layer L2c serving as the main wiring.

Referring to FIG. 19, in the case of the first wiring SL1 based on the first metal, the first wiring SL1 to which the low reflection structure is applied may have a significantly reduced reflectance in the visible light wavelength band (e.g., a range from about 380 nm to about 800 nm), compared to the first wiring SL1 to which the low reflection structure is not applied.

Referring to FIG. 20, in the case of the second wiring SL2 based on the second metal, the second wiring SL2 to which the low reflection structure is applied may have a significantly reduced reflectance in the visible light wavelength band (e.g., a range from about 380 nm to about 800 nm), compared to the second wiring SL2 to which the low reflection structure is not applied.

Figure 21:
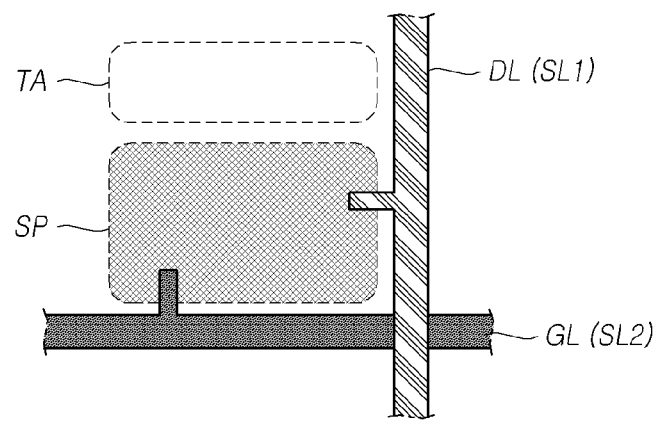
FIG. 21 is a diagram illustrating a data line and a gate line to which the low reflection structure is applied in the first area in the display area of the display device according to aspects of the present disclosure.

FIG. 21 is a diagram illustrating a data line DL and a gate line GL to which the low reflection structure is applied in the first area A1 in the display area AA of the display device 10 according to aspects of the present disclosure.

Figure 22:
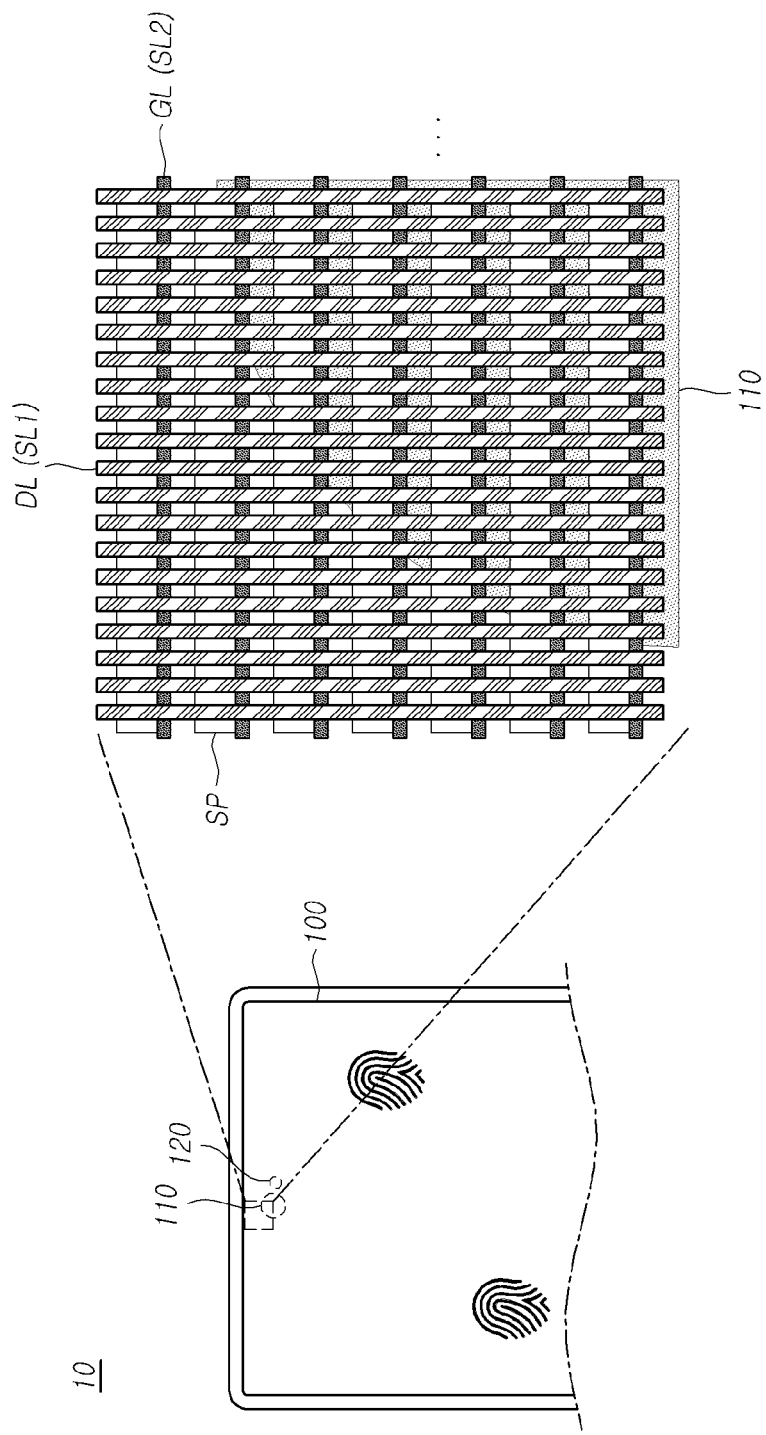
FIG. 22 is a diagram illustrating the camera and subpixels disposed in the first area within the display area of the display device according to aspects of the present disclosure.

FIG. 21 is a diagram briefly showing a subpixel forming region overlapping the first area A1 and a peripheral area of the subpixel forming region. FIG. 22 is a diagram illustrating the camera 110 and subpixels SP disposed in the first area A1 within the display area AA of the display device 10 according to aspects of the present disclosure.

Referring to FIG. 21, the subpixel SP may be connected to the data line DL and the gate line GL.

For example, one of the first wiring SL1 and the second wiring SL2 in FIGS. 17 to 20 may be a row direction display wiring for display driving, and the other may be a column direction display wiring for display driving. For example, the row direction display wiring may be a gate line GL or the like, and the column direction display wiring may be a data line DL or the like.

As an example, as shown in FIG. 21, when the data line DL is a column direction display wiring and the gate line GL is a row direction display line, the first wiring SL1 may be a data line DL. The second wiring SL2 may be a gate line GL.

Referring to FIG. 21, when the subpixel SP overlaps with the first area A1, the periphery of the subpixel SP may have a transmission area TA through which external light is transmitted.

Referring to FIG. 21, all or part of each of the data line DL and the gate line GL connected to the sub-pixel SP may overlap the first area A1 in which the camera 110 is disposed. Accordingly, all or part of each of the data line DL and the gate line GL may have a low reflection structure.

As described above, the subpixel SP of FIG. 21 overlaps the first area A1 in which the camera 110 is disposed.

Therefore, the transistors (DRT, SCT, etc.) and the storage capacitor Cst disposed in the subpixel SP overlapping the first region A1 may have the low reflection structure described above. The above-described low reflection structure is a multi-layer structure further comprising additional layers under the main metal (e.g., first metal, second metal, etc.). Here, additional layers may include an optical path compensation layer configured to make an optical path length difference and a semi-transmissive layer formed of the thin film.

The first area A1 where the camera 110 overlaps may have the same resolution as the second area A2. That is, the number of subpixels SP disposed per unit area in the first area A1 may have the same as the number of subpixels SP disposed per unit area in the second area A2.

To improve the photographing performance of the camera 110 in the first area A1, it is necessary to increase the transmittance of the first area A1 than that of the second area A2. To this end, the first area A1 in which the cameras 110 overlap may have a lower resolution than the second area A2. That is, the number of subpixels SP disposed per unit area in the first area A1 may be less than the number of subpixels SP disposed per unit area in the second area A2.

Figure 23:
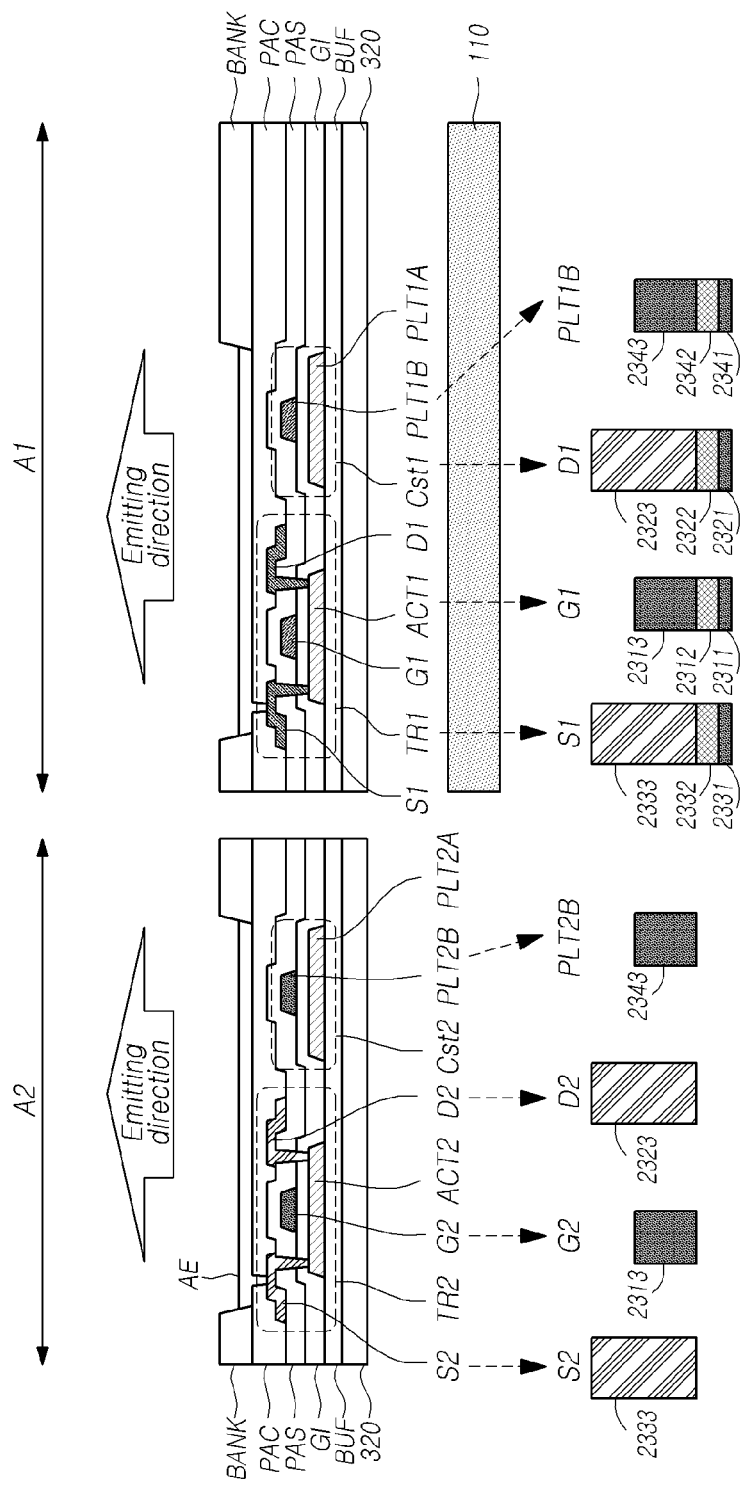
FIG. 23 is a cross-sectional view of the first area and the second area within the display area of the display device according to aspects of the present disclosure.
Figure 24:
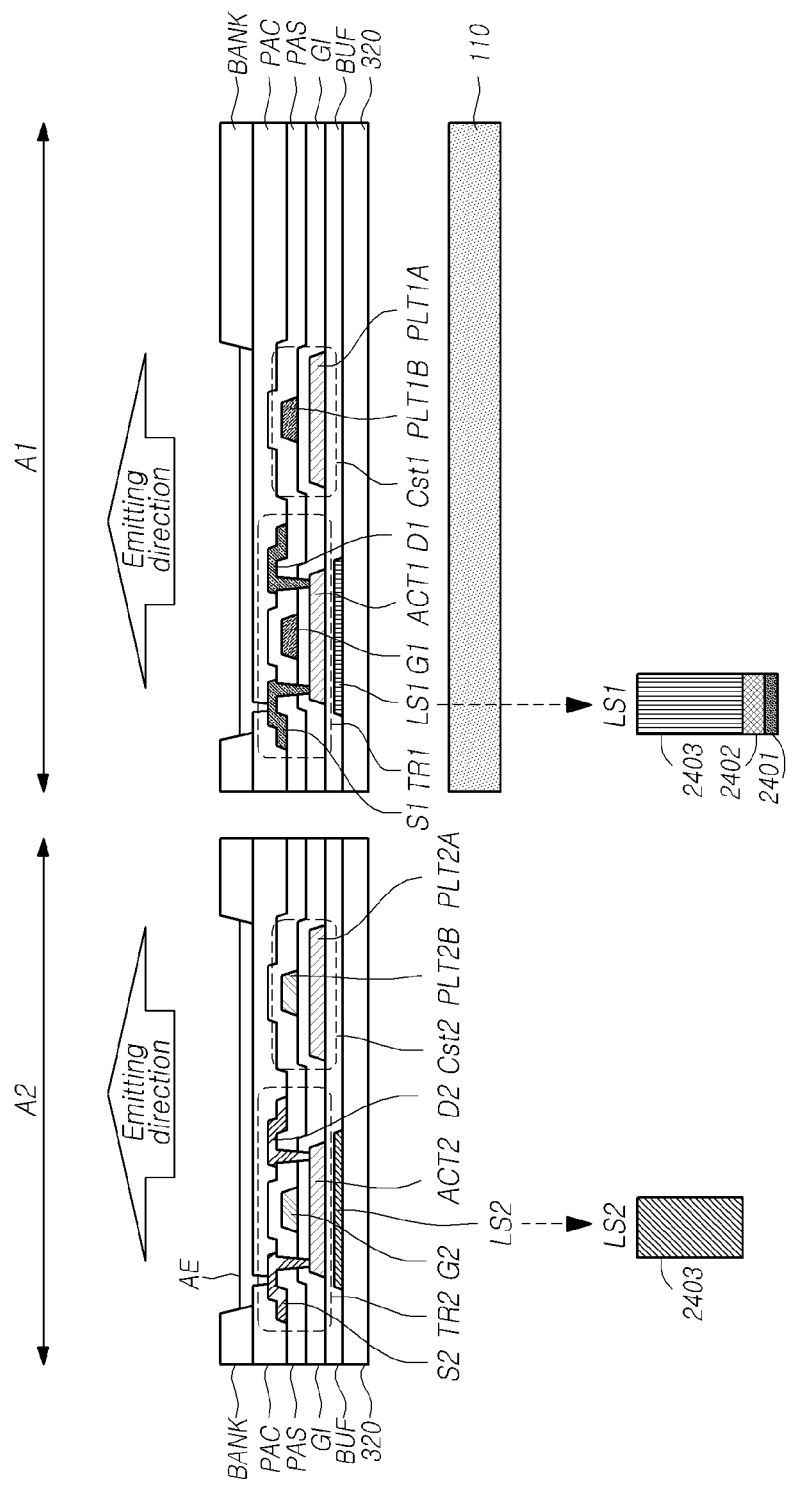
FIG. 24 is another cross-sectional view of the first area and the second area within the display area of the display device according to aspects of the present disclosure.

FIG. 23 is a cross-sectional view of the first area A1 and the second area A2 within the display area AA of the display device 10 according to aspects of the present disclosure, and FIG. 24 is another cross-sectional view of the first area A1 and the second area A2 within the display area AA of the display device 10 according to aspects of the present disclosure.

Referring to FIGS. 23 and 24, as described above, the first transistor TR1 and the first capacitor Cst1 disposed in the subpixel SP in the first area A1 overlapping the camera 110 may have the low reflection structure.

That is, the first transistor TR1 and the first capacitor Cst1 disposed in the subpixel SP in the first area A1 overlapping the camera 110 may be formed of a triple layer.

Referring to FIGS. 23 and 24, the second transistor TR2 and the second capacitor Cst2 disposed in the subpixel SP in the second area A2 that is not overlapped with the camera 110 may not have a low reflection structure. That is, the second transistor TR2 and the second capacitor Cst2 disposed in the subpixel SP in the second area A2 that is not overlapped with the camera 110 may be formed of a single layer.

Hereinafter, structures of the first transistor TR1 and the first capacitor Cst1 disposed in the subpixel SP in the first area A1 will be described. The structures of the second transistor TR2 and the second capacitor Cst2 disposed in the subpixel SP in the second area A2 will be described.

However, in FIGS. 23 and 24, it is assumed that the first and second transistors TR1 and TR2 have a top gate structure. However, as illustrated in FIG. 9, the first and second transistors TR1 and TR2 may have a bottom gate structure.

Referring to FIGS. 23 and 24, a stacked structure of the first area A1 will be described.

The first transistor TR1 may be positioned over the substrate 320, may not overlap the second area A2, and may overlap the first area A1.

A buffer layer BUF may be disposed on the substrate 320.

An active layer ACT1 of the first transistor TR1 may be disposed on the buffer layer BUF layer.

The gate insulating layer GI may be disposed on the active layer ACT1 of the first transistor TR1.

The gate electrode G1 of the first transistor TR1 may be disposed on the gate insulating layer GI.

A passivation layer PAS may be disposed on the gate insulating layer GI while covering the gate electrode G1.

The source electrode S1 and the drain electrode D1 of the first transistor TR1 may be disposed on the passivation layer PAS.

The source electrode S1 of the first transistor TR1 may be connected to a first portion of the active layer ACT1 through a double contact hole of the passivation layer PAS and the gate insulating layer GI. The drain electrode D1 of the first transistor TR1 may be connected to another second portion of the active layer ACT1 through a double contact hole of the passivation layer PAS and the gate insulating layer GI.

In the active layer ACT1 of the first transistor TR1, the first portion connected to the source electrode S1 of the first transistor TR1 and the second portion connected to the drain electrode D1 of the first transistor TR1 may be a conductor portion. In the active layer ACT1 of the first transistor TR1, a channel of the first transistor TR1 may be formed between the first portion and the second portion.

The first transistor TR1 may be a driving transistor DRT or a scan transistor SCT in the subpixel SP. The first transistor TR1 of FIGS. 23 and 24 may be a driving transistor DRT in the subpixel SP as an example. In this case, the source electrode S1 (or drain electrode D1) of the first transistor TR1 may be electrically connected to the anode electrode AE of the light emitting element ED.

The insulating layer PAC may be disposed on the passivation layer PAS while covering the source electrode S1 and the drain electrode D1 of the first transistor TR1. The anode electrode AE may be disposed on the insulating layer PAC. The anode electrode AE may be connected to the source electrode S1 (or drain electrode D1) of the first transistor TR1 through the contact hole of the insulating layer PAC.

The bank BANK defining an emission region of the subpixel SP may be disposed on the insulating layer PAC.

Referring to FIGS. 23 and 24, the first capacitor Cst1 disposed in the first area A1 may include two plates PLT1A and PLT1B spaced apart from each other. The first plate PLT1A of the two plates PLT1A and PLT1B may be an electrode in which the same material (semiconductor material) as the active layer ACT1 is in a conductor state. The second plate PLT1B of the two plates PLT1A and PLT1B may be the same gate metal as the gate electrode G1.

Referring to FIGS. 23 and 24, a stacked structure for the second area A2 will be described.

The second transistor TR2 may be positioned over the substrate 320, may not overlap with the first area A1, and may overlap with the second area A2.

A buffer layer BUF may be disposed on the substrate 320.

An active layer ACT2 of the two transistors TR2 may be disposed on the buffer layer BUF.

The gate insulating layer GI may be disposed on the active layer ACT2 of the second transistor TR2.

The gate electrode G2 of the second transistor TR2 may be disposed on the gate insulating layer GI.

A passivation layer PAS may be disposed on the gate insulating layer GI while covering the gate electrode G2.

The source electrode S2 and the drain electrode D2 of the second transistor TR2 may be disposed on the passivation layer PAS.

The source electrode S2 of the second transistor TR2 may be connected to a first portion of the active layer ACT2 through the double contact holes of the passivation layer PAS and the gate insulating layer GI. The drain electrode D2 of the second transistor TR2 may be connected to the other second portion of the active layer ACT1 through the double contact holes of the passivation layer PAS and the gate insulating layer GI.

In the active layer ACT1 of the second transistor TR2, the first portion connected to the source electrode S2 of the second transistor TR2 and the second portion connected to the drain electrode D2 of the second transistor TR2 may be a conductor portion. In the active layer ACT2 of the second transistor TR2, a channel of the second transistor TR2 may be formed between the first portion and the second portion.

The second transistor TR2 may be a driving transistor DRT or a scan transistor SCT in the subpixel SP. The second transistor TR2 of FIGS. 23 and 24 may be a driving transistor DRT in the subpixel SP as an example. In this case, the source electrode S2 (or drain electrode D2) of the second transistor TR2 may be electrically connected to the anode electrode AE of the light emitting element ED.

The insulating layer PAC may be disposed on the passivation layer PAS while covering the source electrode S2 and the drain electrode D2 of the second transistor TR2. The anode electrode AE may be disposed on the insulating layer PAC. The anode electrode AE may be connected to the source electrode S2 (or drain electrode D2) of the second transistor TR2 through the contact hole of the insulating layer PAC.

A bank BANK defining an emission area of the subpixel SP may be disposed on the insulating layer PAC.

Referring to FIG. 23, the second capacitor Cst2 disposed in the second area A2 may include two plates PLT2A and PLT2B spaced apart from each other. The first plate PLT2A of the two plates PLT2A and PLT2B may be an electrode in which the same material (semiconductor material) as the active layer ACT2 is in a conductor state. The second plate PLT2B of the two plates PLT2A and PLT2B may be the same gate metal as the gate electrode G2.

Referring to FIG. 23, the first transistor TR1 in which all or a part of the camera 110 overlaps may have a low reflection structure.

Referring to FIG. 23, the source electrode S1 of the first transistor TR1 may include a first source electrode layer 2331, a second source electrode layer 2332 and a third source electrode layer 2333.

The first source electrode layer 2331 may have a material and thickness corresponding to the first semi-transmissive layer L1a. The second source electrode layer 2332 may have a material and thickness corresponding to the first optical path compensation layer L1b. The third source electrode layer 2333 may include a first metal that is a source-drain metal.

The drain electrode D1 of the first transistor TR1 may include a first drain electrode layer 2321, a second drain electrode layer 2322, and a third drain electrode layer 2323.

The first drain electrode layer 2321 may have a material and thickness corresponding to the first semi-transmissive layer L1a. The second drain electrode layer 2322 may have a material and a thickness corresponding to the first optical path compensation layer L1b. The third drain electrode layer 2323 may include a first metal that is a source-drain metal.

The gate electrode G1 of the first transistor TR1 may include a first gate electrode layer 2311, a second gate electrode layer 2312 and a third gate electrode layer 2313.

The first gate electrode layer 2311 may have a material and thickness corresponding to the second semi-transmissive layer L2a. The second gate electrode layer 2312 may have a material and thickness corresponding to the second optical path compensation layer L2b. The third gate electrode layer 2313 may include a second metal that is a gate metal.

Referring to FIG. 23, the second transistor TR2 that does not overlap with the camera 110 may not have a low reflection structure (triple layer structure) and may have a general structure (single layer structure). In some cases, the second transistor TR2 that does not overlap the camera 110 may also have a low reflection structure (triple layer structure) like the first transistor TR1.

Referring to FIG. 23, the source electrode S2 of the second transistor TR2 may include the third source electrode layer 2333 including a main metal, but may not include the first source electrode layer 2331 and the second source electrode layer 2332. The drain electrode D2 of the second transistor TR2 may include the third drain electrode layer 2323 including a main metal, but may not include the first drain electrode layer 2321 and the second drain electrode layer 2322. The gate electrode G2 of the second transistor TR2 may include the third gate electrode layer 2313 including the main metal, but may not include the first gate electrode layer 2311 and the second gate electrode layer 2312.

Referring to FIG. 23, the display panel 100 may further include a first capacitor Cst1 positioned over the substrate 320 and not overlapping with the second area A2 and overlapping with the first area A1.

The first capacitor Cst1 may include two plates PLT1A and PLT1B spaced apart from each other. At least one (e.g., PLT1B) of the two plates PLT1A and PLT1B may include a first plate layer 2341, a second plate layer 2342, and a third plate layer 2343. That is, at least one (e.g., PLT1B) of the two plates PLT1A and PLT1B of the first capacitor Cst1 disposed in the first area A1 overlapping the camera 110 may have the low reflection structure.

The first plate layer 2341 may have a material and thickness corresponding to the first semi-transmissive layer L1a. The second plate layer 2342 may have a material and thickness corresponding to the first optical path compensation layer L1b. The third plate layer 2343 may include a first metal as a source-drain metal or a second metal as a gate metal.

The display panel 100 may further include a second capacitor Cst2 positioned over the substrate 320 and not overlapping with the first area A1 and overlapping with the second area A2.

The second capacitor Cst2 may include two plates PLT2A and PLT2B spaced apart from each other. Each of the two plates PLT2A and PLT2B may be formed as a single layer. The first plate PLT2A of the second capacitor Cst2 may include the same material as the third plate layer 2343 of the first capacitor Cst1, or may be disposed on the same layer as the third plate layer 2343 of the first capacitor Cst1.

Referring to FIG. 24, the display panel 100 may further include a first light shield LS1 disposed under the active layer ACT1 of the first transistor TR1. The first light shield LS1 overlapping the camera 110 in the first area A1 may be a pattern for protecting the channel of the first transistor TR1.

The first light shield LS1 in the first area A1 overlapping the camera 110 may have the low reflection structure. That is, the first light shield LS1 in the first area A1 overlapping the camera 110 may include a first light shield layer 2401 located over the substrate 320, a second light shield layer 2402 located on the first light shield layer 2401, and a third light shield layer 2403 located on the second light shield layer 2402.

In the first light shield LS1, the first light shield layer 2401 may be thinner than the second light shield layer 2402, the first light shield layer 2401 may have a material corresponding to the first semi-transmissive layer L1a, and the second light shield layer 2402 may have a material corresponding to the first light path compensation layer L1b.

Referring to FIG. 24, the display panel 100 may further include a second light shield LS2 disposed under the active layer ACT2 of the second transistor TR2 and disposed in the second area A2 not overlapping the camera 110. The second light shield LS2 that does not overlap the camera 110 may be a pattern that protects the channel of the second transistor TR2.

The second light shield LS2 disposed in the second area A2 not overlapping the camera 110 may include the third light shield layer 2403, and may not include the first light shield layer 2401 and the second light shield Layer 2402.

In other words, the second light shield LS2 disposed in the second area A2 not overlapping the camera 110 may have a single layer structure.

Figure 25:
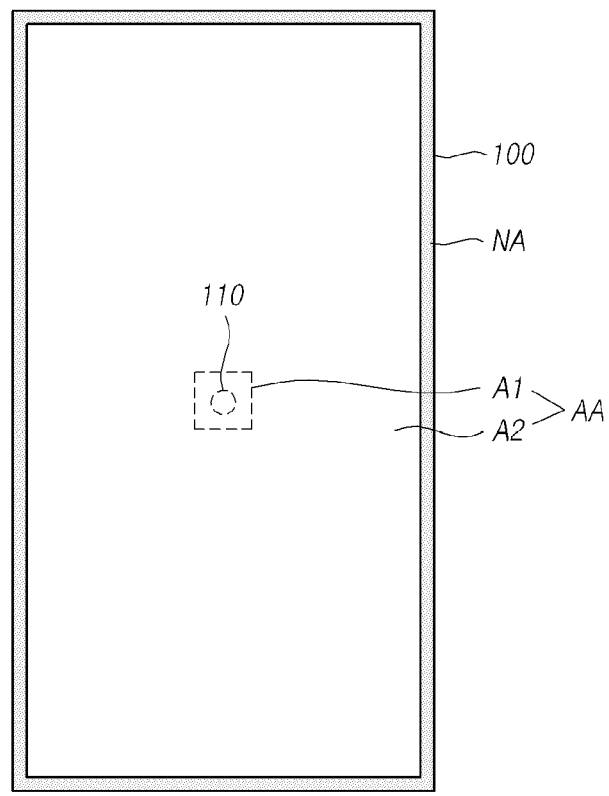
FIG. 25 is a diagram illustrating a case where the camera is positioned in the center of the display area in the display device according to aspects of the present disclosure.

FIG. 25 is a diagram illustrating a case where the camera 110 is positioned in the center of the display area AA in the display device 10 according to aspects of the present disclosure.

Referring to FIG. 25, the display area AA of the display panel 100 may include the first area A1 overlapping the camera 110 and the second area A2 different from the first area A1.

The first area A1 may be located in the display area AA, but may be located in a boundary area adjacent to the non-display area NA, which is an outer area of the display area AA. In this case, only a part of the first area A1 may be surrounded by the second area A2. The first area A1 may exist in the upper portion of the display device 10.

Alternatively, as illustrated in FIG. 25, the first area A1 may be located at the center of the display area AA. In this case, the first area A1 may be surrounded by the second area A2 in all directions.

The aspects of the present disclosure described above may provide a display device including a display panel and a camera. The display panel may include a display area on which an image is displayed, a substrate, and a first wiring located over the substrate and disposed in the display area. The camera may photograph the front of the display panel without being exposed to the front surface of the display panel, be disposed under the display area of the display panel, and overlap a first area in the display area.

In a display device according to aspects of the present disclosure, all or part of the first wiring may overlap the first area. A first portion overlapping the first area in the first wiring may comprise: a first semi-transmissive layer positioned over the substrate; a first optical path compensation layer positioned on the first semi-transmissive layer; and a first metal layer positioned on the first optical path compensation layer and including a first metal.

In a display device according to aspects of the present disclosure, the first semi-transmissive layer may have a thickness thinner than a thickness of the first optical path compensation layer.

In a display device according to aspects of the present disclosure, among the first semi-transmissive layer, the first optical path compensation layer and the first metal layer, the thickness of the first semi-transmissive layer closest to the camera may be the thinnest, and the thickness of the first metal layer closest to a portion where external light is incident may be the thickest.

In a display device according to aspects of the present disclosure, the first semi-transmissive layer may have a thickness of 1 to 5 nm, and the first optical path compensation layer may have a thickness of 30 to 120 nm.

In a display device according to aspects of the present disclosure, an external light may be incident on a side opening of the first wiring and reflected from a front surface of the camera. A part of the external light reflected from the front surface of the camera may be reflected from a rear surface of the first semi-transmissive layer. Another part of the external light reflected from the front surface of the camera may pass through the first semi-transmissive layer and the first optical path compensation layer and may be reflected from a rear surface of the first metal layer.

In a display device according to aspects of the present disclosure, the external light reflected from the rear surface of the first semi-transmissive layer and the external light reflected from the rear surface of the first metal layer may have a phase difference by an odd multiple of 180 degrees.

In a display device according to aspects of the present disclosure, the first optical path compensation layer may comprise a conductive transparent material.

In a display device according to aspects of the present disclosure, the display area may comprise the first area and a second area excluding the first area, the first wiring may comprise the first portion overlapping the first area and a second portion overlapping the second area different from the first area. The second portion of the first wiring may comprise the first metal layer, and may not comprise the first semi-transmissive layer and the first optical path compensation layer.

The display device according to aspects of the present disclosure may further comprise a second wiring located over the substrate and disposed in the display area, wherein all or part of the second wiring may overlap the first area.

In a display device according to aspects of the present disclosure, a portion overlapping the first area in the second wiring may comprise: a second semi-transmissive layer positioned over the substrate; a second optical path compensation layer positioned on the second semi-transmissive layer; and a second metal layer positioned on the second optical path compensation layer and including a second metal different from the first metal.

In a display device according to aspects of the present disclosure, the first semi-transmissive layer and the second semi-transmissive layer may comprise the same material. The first optical path compensation layer and the second optical path compensation layer may comprise the same material.

In a display device according to aspects of the present disclosure, an external light may enter an opening between the first wiring and the second wiring from the upper portion of the substrate and may be directed toward the front of the camera.

In a display device according to aspects of the present disclosure, one of the first wiring and the second wiring may be a row direction display wiring for display driving, and the other may be a column direction display wiring for display driving.

The display device according to aspects of the present disclosure may further comprise a first transistor located over the substrate and overlapping the first area.

In a display device according to aspects of the present disclosure, a source electrode of the first transistor may comprise a first source electrode layer, a second source electrode layer and a third source electrode layer. The first source electrode layer may have a material and thickness corresponding to the material and thickness of the first semi-transmissive layer, the second source electrode layer may have a material and thickness corresponding to the material and thickness of the first optical path compensation layer, and the third source electrode layer may comprise the first metal.

In a display device according to aspects of the present disclosure, a drain electrode of the first transistor may comprise a first drain electrode layer, a second drain electrode layer and a third drain electrode layer. The first drain electrode layer may have a material and thickness corresponding to the material and thickness of the first semi-transmissive layer, the second drain electrode layer may have a material and thickness corresponding to the material and thickness of the first optical path compensation layer, and the third drain electrode layer may comprise the first metal.

In a display device according to aspects of the present disclosure, a gate electrode of the first transistor may comprise a first gate electrode layer, a second gate electrode layer and a third gate electrode layer. The first gate electrode layer may have a material and thickness corresponding to the material and thickness of the second semi-transmissive layer, the second gate electrode layer may have a material and thickness corresponding to the material and thickness of the second optical path compensation layer, and the third gate electrode layer may comprise the second metal.

The display device according to aspects of the present disclosure may further comprise a light shield disposed under an active layer of the first transistor.

In a display device according to aspects of the present disclosure, the light shield may comprise a first light shield layer positioned over the substrate, a second light shield layer positioned on the first light shield layer, and a third light shield layer positioned on the second light shield layer.

In a display device according to aspects of the present disclosure, the first light shield layer may be thinner than the second light shield layer, the first light shield layer may have a material corresponding to the first semi-transmissive layer, and the second light shield layer may have a material corresponding to the first optical path compensation layer.

The display device according to aspects of the present disclosure may further comprise a second transistor located over the substrate and overlapping the second area different from the first area in the display area.

In a display device according to aspects of the present disclosure, the source electrode of the second transistor may comprise the third source electrode layer, and may not comprise the first source electrode layer and the second source electrode layer. The drain electrode of the second transistor may comprise the third drain electrode layer, and may not comprise the first drain electrode layer and the second drain electrode layer. The gate electrode of the second transistor may comprise the third gate electrode layer, and may not comprise the first gate electrode layer and the second gate electrode layer.

The display device according to aspects of the present disclosure may further comprise a first capacitor located over the substrate and overlapping the first area. The first storage capacitor may comprise two plates spaced apart from each other. At least one of the two plates may comprise a first plate layer, a second plate layer and a third plate layer.

In a display device according to aspects of the present disclosure, the first plate layer may have a material and thickness corresponding to the first semi-transmissive layer. The second plate layer may have a material and thickness corresponding to the first optical path compensation layer. And the third plate layer may comprise the first metal or the second metal.

The display device according to aspects of the present disclosure may further comprise a second capacitor located over the substrate and overlapping the second area different from the first area in the display area. The second storage capacitor may comprise two plates spaced apart from each other, and each of the two plates of the second storage capacitor may be a single layer.

The display device according to aspects of the present disclosure may further comprise: a transistor array positioned in the display area and disposed over the substrate; an anode electrode layer positioned on the transistor array; a light emitting layer positioned on the anode electrode layer; a cathode electrode layer positioned on the light emitting layer; and an encapsulation layer positioned on the cathode electrode layer.

In a display device according to aspects of the present disclosure, the display area may comprise the first area and the second area. The cathode electrode layer may comprise a first cathode electrode overlapping the first area, and a second cathode electrode overlapping a second area different from the first area.

In a display device according to aspects of the present disclosure, the first cathode electrode may be a transparent cathode electrode having a first transmittance equal to or greater than a predetermined threshold transmittance.

In a display device according to aspects of the present disclosure, the first cathode electrode and the second cathode electrode may be separated from each other, and the second cathode electrode may have a second transmittance less than the first transmittance.

The display device according to aspects of the present disclosure may further comprise: a touch sensor layer disposed on the encapsulation layer and including a plurality of touch electrodes; a touch pad unit positioned on the substrate and positioned in a non-display area outside the display area; and a plurality of touch lines electrically connected to all or part of the touch electrodes and descending along an inclined surface of the encapsulation layer to be electrically connected to the touch pad unit positioned in the non-display area.

The display device according to aspects of the present disclosure may further comprise: a light generating device; and a proximity sensor detecting a surrounding human body or object using light emitted from the light generating device, wherein the light generating device may be located on the encapsulation layer and may be located on the side of the touch sensor layer, and wherein the proximity sensor may be located under the substrate and overlaps the first area.

In a display device according to aspects of the present disclosure, each of the touch electrodes positioned in the first area among the plurality of touch electrodes may comprise a transparent electrode or a mesh-type electrode having one or more openings.

In a display device according to aspects of the present disclosure, the display area may comprise the first area overlapping the camera and the second area different from the first area.

In a display device according to aspects of the present disclosure, for example, the first area may be located in the display area, and may be located in a boundary area adjacent to a non-display area located outside the display area, and only a part of the first area may be surrounded by the second area.

In a display device according to aspects of the present disclosure, for another example, the first area may be located in the center of the display area, and wherein the first area may be surrounded by the second area in all directions.

The aspects of the present disclosure described above may provide a display device, comprising: a display panel including a display area on which an image is displayed, a substrate, and an electrode located over the substrate and disposed in the display area; and a camera photographing the front of the display panel without being exposed to the front surface of the display panel, being disposed under the display area of the display panel, and overlapping a first area in the display area.

In a display device according to aspects of the present disclosure, the electrode may overlap the first area, and wherein the electrode may comprise a semi-transmissive layer positioned over the substrate, an optical path compensation layer positioned on the semi-transmissive layer, and a metal layer positioned on the optical path compensation layer.

In a display device according to aspects of the present disclosure, the semi-transmissive layer may have a thickness thinner than a thickness of the optical path compensation layer.

In a display device according to aspects of the present disclosure, the electrode may be an electrode of a transistor in a subpixel overlapping the first area, or a plate of a capacitor overlapping the first area.

According to aspects of the present disclosure, it is possible to provide a display device in which the camera photographing the front is disposed under the display panel so that the camera is not exposed to the front.

According to aspects of the present disclosure, it is possible to provide a display device capable of acquiring a high quality front image even when the camera photographing the front is disposed under the display panel so that the camera is not exposed to the front.

According to aspects of the present disclosure, it is possible to provide a display device that obtains a high-resolution image by preventing the external light from being repeatedly reflected between the wirings in the display panel and the camera. The external light is light required for front shooting of the camera disposed under the display panel, and is light that enters the interior of the display panel.

The above description and the accompanying drawings exemplify the technical idea of the present disclosure, and various modifications and changes such as combination, separation, substitution, and alteration of configurations may be made by those skilled in the art without departing from the essential features of the present disclosure. Accordingly, the aspects disclosed in the present disclosure are not to restrict the technical idea of the present disclosure but to explain the technical idea of the present disclosure. The technical idea of the present disclosure is not limited to the aspects. The scope of the present disclosure is defined by the appended claims, and all the technical ideas within a range equivalent thereto should be construed as belonging to the scope of the present disclosure.

What is claimed is:

1. A display device, comprising:
    a display panel comprising: a display area including a first area and a second area different from the first area, and a non-display area outside of the display area, and comprising:
    a substrate;
    an anode electrode layer disposed on a transistor array;
    a light emitting layer positioned on the anode electrode layer;
    a cathode electrode layer positioned on the light emitting layer; and
    an encapsulation layer disposed on the cathode electrode layer;
    an optical device positioned under the display panel and overlapping the first area of the display area;
    at least two lines including a first line and a second line different from the first line, and at least a portion of the at least two lines disposed in the first area overlapping the optical device;
    a touch sensor layer disposed on the encapsulation layer and comprising a plurality of touch electrodes;
    a touch pad portion positioned over the substrate and positioned in the non-display area; and
    a plurality of touch lines electrically connected to one or more of the plurality of touch electrodes and electrically connected to the touch pad portion;
    wherein the cathode electrode layer comprises a first cathode electrode layer disposed in the first area and a second cathode electrode layer disposed in the second area.

2. The display device of claim 1, wherein the at least two lines comprise signal lines, electrodes, or metal patterns.

3. The display device of claim 1, wherein at least one of the first line and the second line comprises a plurality of layers.

4. The display device of claim 3, wherein the plurality of layers comprise a semi-transmissive layer, an optical path compensation layer, and a metal layer.

5. The display device of claim 4, wherein the first line comprises a first portion overlapping the first area and a second portion overlapping the second area, and the semi-transmissive layer, the optical path compensation layer, and the metal layer comprised in the first line are disposed in the first portion overlapping the first area.

6. The display device of claim 5, wherein while the metal layer comprised in the first line is disposed in at least a portion of the second portion, the optical path compensation layer and the metal layer are not disposed in the at least a portion of the second portion.

7. The display device of claim 4, wherein the semi-transmissive layer, the optical path compensation layer, and the metal layer comprised in the second line are disposed in a portion of the second line overlapping the first area.

8. The display device of claim 4, wherein the semi-transmissive layer has a thickness thinner than a thickness of the optical path compensation layer, and
    wherein the optical path compensation layer comprises a conductive transparent material.

9. The display device of claim 4, wherein among the semi-transmissive layer, the optical path compensation layer and the metal layer, the thickness of the semi-transmissive layer closest to the optical device is the thinnest, and the thickness of the metal layer closest to a portion where external light is incident is the thickest.

10. The display device of claim 4, further comprising a first transistor located over the substrate and overlapping the first area,
- wherein a source electrode of the first transistor comprises a first source electrode layer, a second source electrode layer and a third source electrode layer, the first source electrode layer has a material corresponding to the material of the semi-transmissive layer, the second source electrode layer has a material corresponding to the material of the optical path compensation layer, the third source electrode layer comprises a first metal,
- wherein a drain electrode of the first transistor comprises a first drain electrode layer, a second drain electrode layer and a third drain electrode layer, the first drain electrode layer has a material corresponding to the material of the semi-transmissive layer, the second drain electrode layer has a material corresponding to the material of the optical path compensation layer, the third drain electrode layer comprises the first metal, and
- wherein a gate electrode of the first transistor comprises a first gate electrode layer, a second gate electrode layer and a third gate electrode layer, the first gate electrode layer has a material corresponding to the material of the semi-transmissive layer, the second gate electrode layer has a material corresponding to the material of the optical path compensation layer, the third gate electrode layer comprises a second metal.

11. The display device of claim 10, further comprising a light shield disposed under an active layer of the first transistor,
- wherein the light shield comprise a first light shield layer positioned over the substrate, a second light shield layer positioned on the first light shield layer of the first line, and a third light shield layer positioned on the second light shield layer of the second line,
- wherein the first light shield layer is thinner than the second light shield layer, and
- wherein the first light shield layer has a material corresponding to the semi-transmissive layer, the second light shield layer has a material corresponding to the optical path compensation layer.

12. The display device of claim 10, further comprising a second transistor located over the substrate and overlapping the second area in the display area,
- wherein a source electrode of the second transistor comprises the third source electrode layer, and does not comprise the first source electrode layer and the second source electrode layer,
- wherein a drain electrode of the second transistor comprises the third drain electrode layer, and does not comprise the first drain electrode layer and the second drain electrode layer, and
- wherein a gate electrode of the second transistor comprises the third gate electrode layer, and does not comprise the first gate electrode layer and the second gate electrode layer.

13. The display device of claim 4, further comprising a first capacitor located over the substrate and overlapping the first area,
- wherein the first capacitor comprises two plates spaced apart from each other,
- wherein at least one of the two plates comprises a first plate layer, a second plate layer and a third plate layer, and
- wherein the first plate layer has a material corresponding to the semi-transmissive layer, the second plate layer has a material corresponding to the optical path compensation layer, and the third plate layer has a material corresponding to the metal layer.

14. The display device of claim 13, further comprising a second capacitor located over the substrate and overlapping the second area in the display area,
- wherein the second capacitor comprises two plates spaced apart from each other, each of the two plates of the second capacitor is a single layer.

15. The display device of claim 1, wherein the first line is disposed in a first direction, and the second line is disposed in a second direction different from the first direction.

16. The display device of claim 15, wherein the first direction is perpendicular to the second direction.

17. The display device of claim 1, wherein the first cathode electrode is a transparent cathode electrode having a first transmittance equal to or greater than a predetermined threshold transmittance, and
- wherein the second cathode electrode has a second transmittance less than the first transmittance.

18. The display device of claim 1, further comprising:
a light generating device; and
a proximity sensor detecting a surrounding human body or object using light emitted from the light generating device,
- wherein the light generating device is located on the encapsulation layer and is located on the side of the touch sensor layer, and
- wherein the proximity sensor is located under the substrate and overlaps the first area.

19. The display device of claim 1, wherein the first area is located in the center of the display area, and
- wherein the first area is surrounded by the second area in all directions.

* * * * *